(12) United States Patent
Qin et al.

(10) Patent No.: US 7,584,881 B2
(45) Date of Patent: Sep. 8, 2009

(54) LOW LOOP HEIGHT BALL BONDING METHOD AND APPARATUS

(75) Inventors: Ivy Wei Qin, Lansdale, PA (US); Robert Wise, Telford, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 185 days.

(21) Appl. No.: 11/942,997

(22) Filed: Nov. 20, 2007

(65) Prior Publication Data

US 2008/0111252 A1 May 15, 2008

Related U.S. Application Data

(62) Division of application No. 10/988,053, filed on Nov. 12, 2004, now Pat. No. 7,347,352.

(60) Provisional application No. 60/525,305, filed on Nov. 26, 2003.

(51) Int. Cl.
*B23K 31/02* (2006.01)
*H01L 23/49* (2006.01)

(52) U.S. Cl. .................... 228/180.5; 257/784

(58) Field of Classification Search .......... None
See application file for complete search history.

(56) References Cited

U.S. PATENT DOCUMENTS

| | | | |
|---|---|---|---|
| 4,437,604 A | 3/1984 | Razon et al. | |
| 4,824,005 A | 4/1989 | Smith, Jr. | |
| 5,111,989 A | 5/1992 | Holdgrafer et al. | |
| 5,421,503 A * | 6/1995 | Perlberg et al. | 228/4.5 |
| 5,842,628 A | 12/1998 | Nomoto et al. | |
| 5,961,029 A | 10/1999 | Nishiura et al. | |
| 6,080,651 A | 6/2000 | Takahashi et al. | |
| 6,112,974 A | 9/2000 | Nishiura et al. | |
| 6,182,885 B1 | 2/2001 | Nishiura et al. | |
| 6,222,274 B1 * | 4/2001 | Nishiura et al. | 257/776 |
| 6,250,539 B1 | 6/2001 | Nishiura et al. | |
| 6,715,666 B2 | 4/2004 | Imai et al. | |
| 6,815,836 B2 | 11/2004 | Ano et al. | |
| 6,933,608 B2 | 8/2005 | Fujisawa | |
| 7,188,759 B2 | 3/2007 | Calpito et al. | |
| 2004/0041000 A1 | 3/2004 | Mutaguchi | |
| 2004/0152292 A1 | 8/2004 | Babinetz et al. | |
| 2005/0072833 A1 | 4/2005 | Wong et al. | |
| 2006/0011710 A1 | 1/2006 | Lee et al. | |
| 2006/0175383 A1 | 8/2006 | Mii et al. | |

FOREIGN PATENT DOCUMENTS

EP    1 422 014 A1    5/2004

(Continued)

OTHER PUBLICATIONS

"Wire bonding solutions for 3-D stacked die packages" (Association for Electronic Manufacturing of SME, Third Quarter 2003, www.sme.org/em vol. 18, No. 3; Article by Stephen Babinetz).

(Continued)

*Primary Examiner*—Kiley Stoner
(74) *Attorney, Agent, or Firm*—Christopher M. Spletzer, Sr.

(57) ABSTRACT

In accordance with the invention, a bump is formed on top of a die bond pad by forming a ball bond there. Then, without severing the wire, the capillary undergoes a set of coordinated motions to fold the wire on top of the ball bond. The wire is then bonded on top of the ball bond bump without severing the wire. This is then followed by a further set of coordinated xy motions to from the loop and bring the capillary over the second bond site (e.g., on the lead frame). The wire is then stitch bonded to the second bond site and the tail severed to complete the wire loop interconnect.

5 Claims, 31 Drawing Sheets

FOREIGN PATENT DOCUMENTS

| | | | |
|---|---|---|---|
| JP | 04273135 A | 9/1992 | |
| JP | 06132347 A | 5/1994 | |
| JP | 09051011 A | 2/1997 | |
| JP | 10199916 A | 7/1998 | |
| JP | 2000174054 | 6/2000 | |
| JP | 2000188303 | 7/2000 | |
| JP | 2000252316 | 9/2000 | |
| JP | 2003100793 | 4/2003 | |

OTHER PUBLICATIONS

"Advanced Ultra-Low-Loop Wire Bonds" (SEMICON China 2006; Article by Bob Chylak, Lee Levine, Stephen Babinetz, and O.D. Kwon).

".Ultra-low-loop wire bonds.Interconnect solutions for multi-stack packages" (Advanced Packaging, Jan. 2006, pp. 24-27; www.apmag.com; Article by Bob Chylak, Stephen Babinetz, and Lee Levine).

"Assembly Solutions for 3-D Stacked Devices" (SEMICON Singapore 2002; Article by Mark Klossner and Steve Babinetz).

"Meeting the Assembly Challenges of 3D Packages" (SEMICON China 2002; Article by Ivy Wei Qin, Paul Reid, Paul Bereznycky, and Jeff Swiatek) pp. A-1 to A-9.

"Wedge Bonding For Ultra Fine Pitch Application" (Article by Ivy Wei Qin, Paul Bereznycky and Dave Doerr) Undated. pp. A-1 to A-10.

Stand-Off Stitch Bond (SSB-1) Process User Guide; Kulicke and Soffa Industries, Inc. (pp. 1-12; Feb. 15, 2001).

"Packaging Challenges and Solutions for Multi-Stack Die Applications" B. Chylak and I.W. Qin (SEMICON West 2002) 7 pages.

International Search Report Issued on Nov. 17, 2005, for International Application No. PCT/US04/39676.

\* cited by examiner

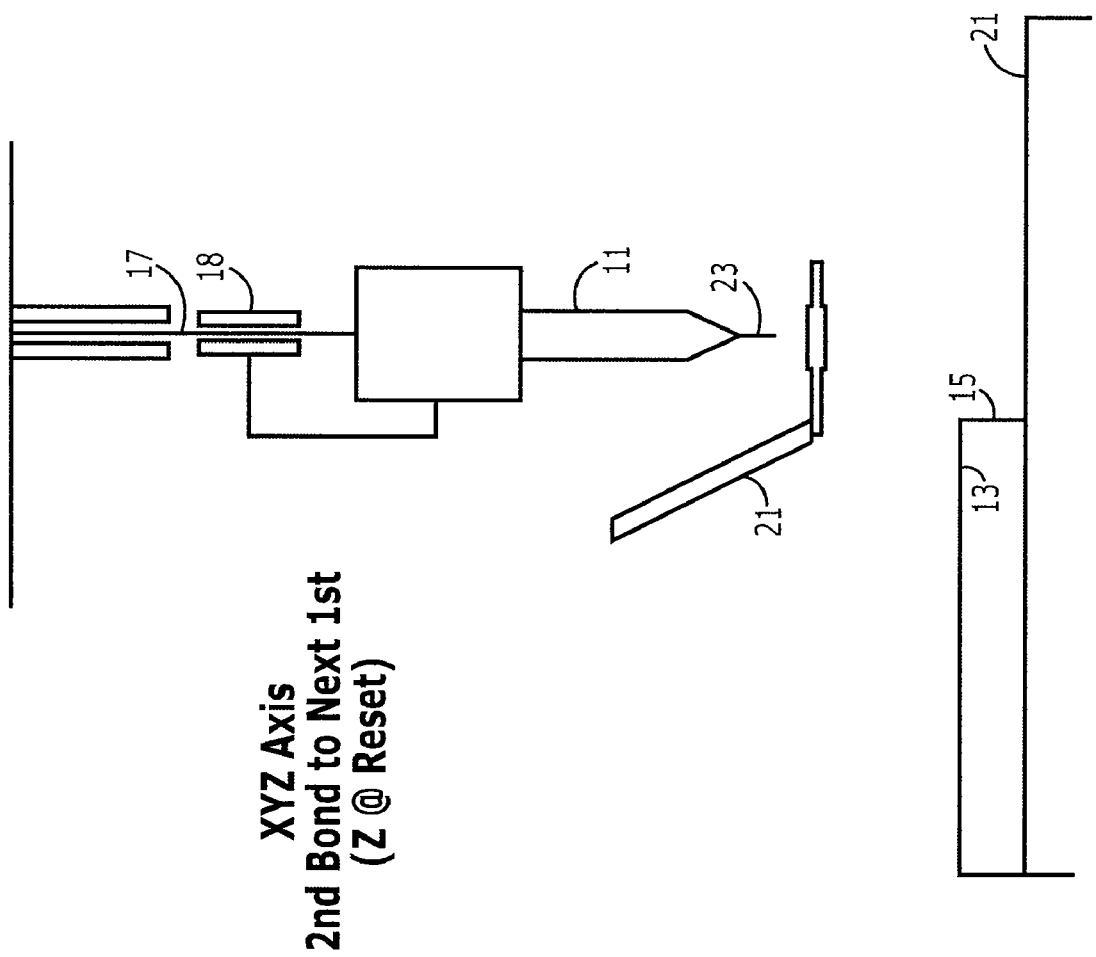

1st Bond
- Z Axis Force
- USG Power
- USG Time

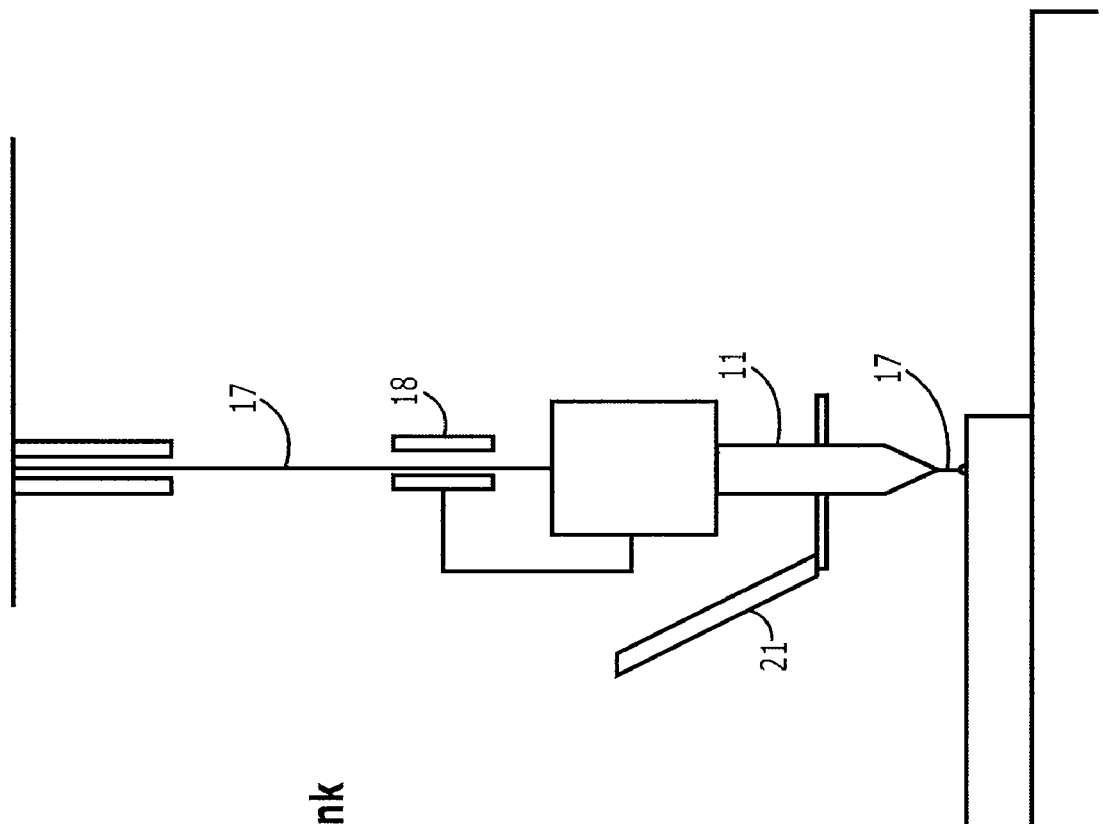

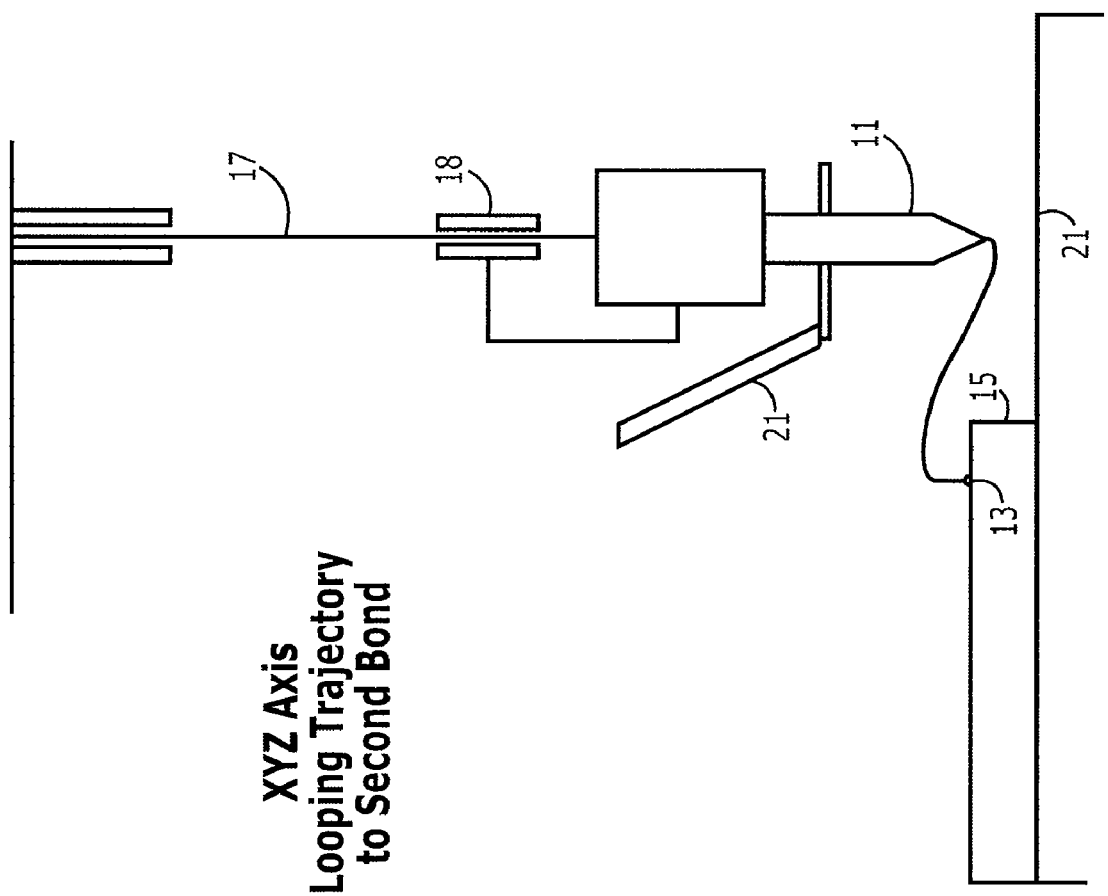

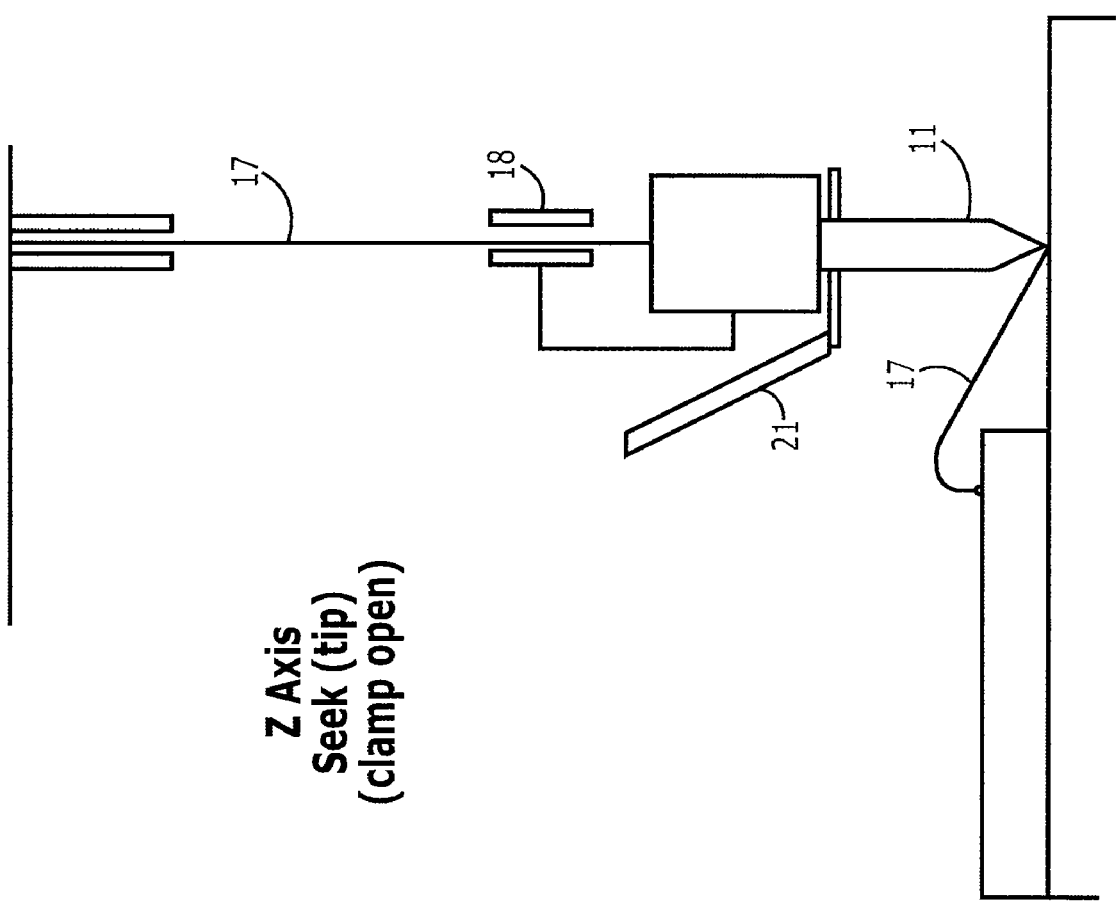

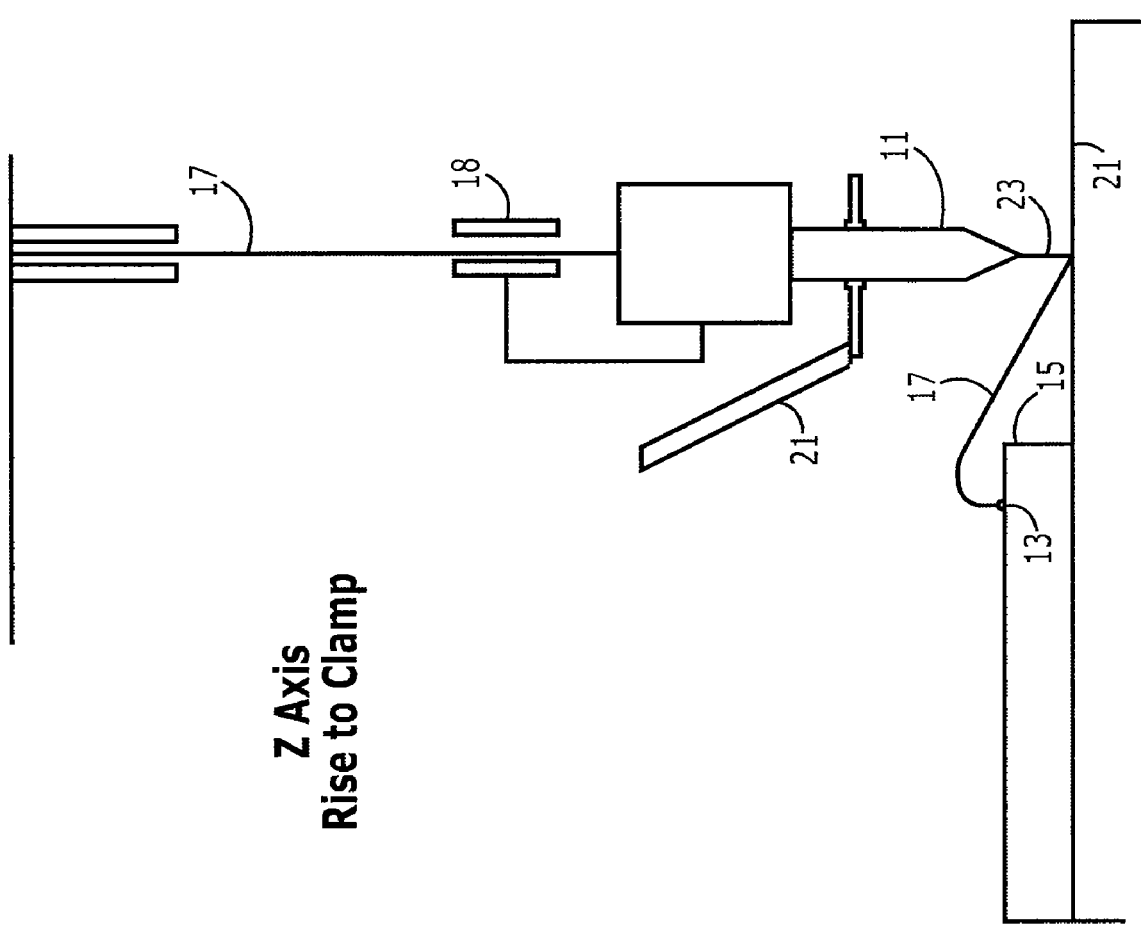

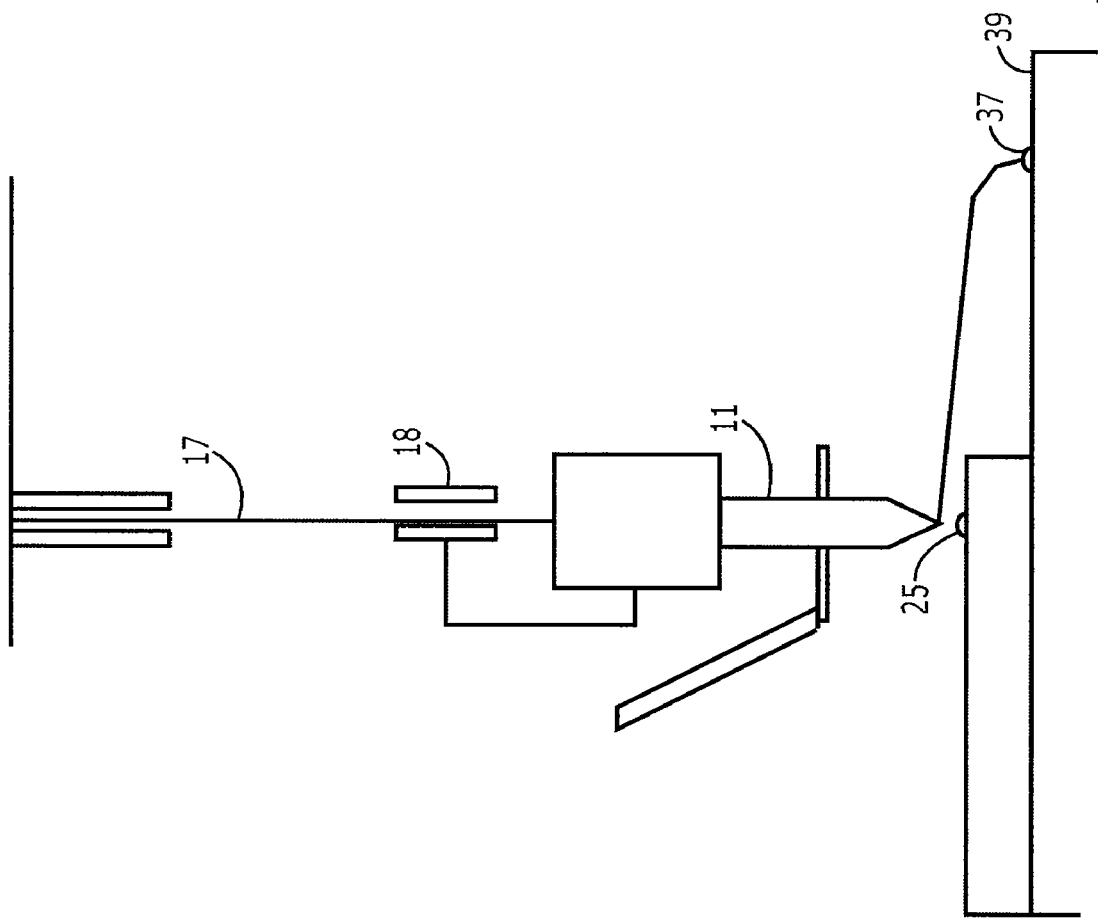

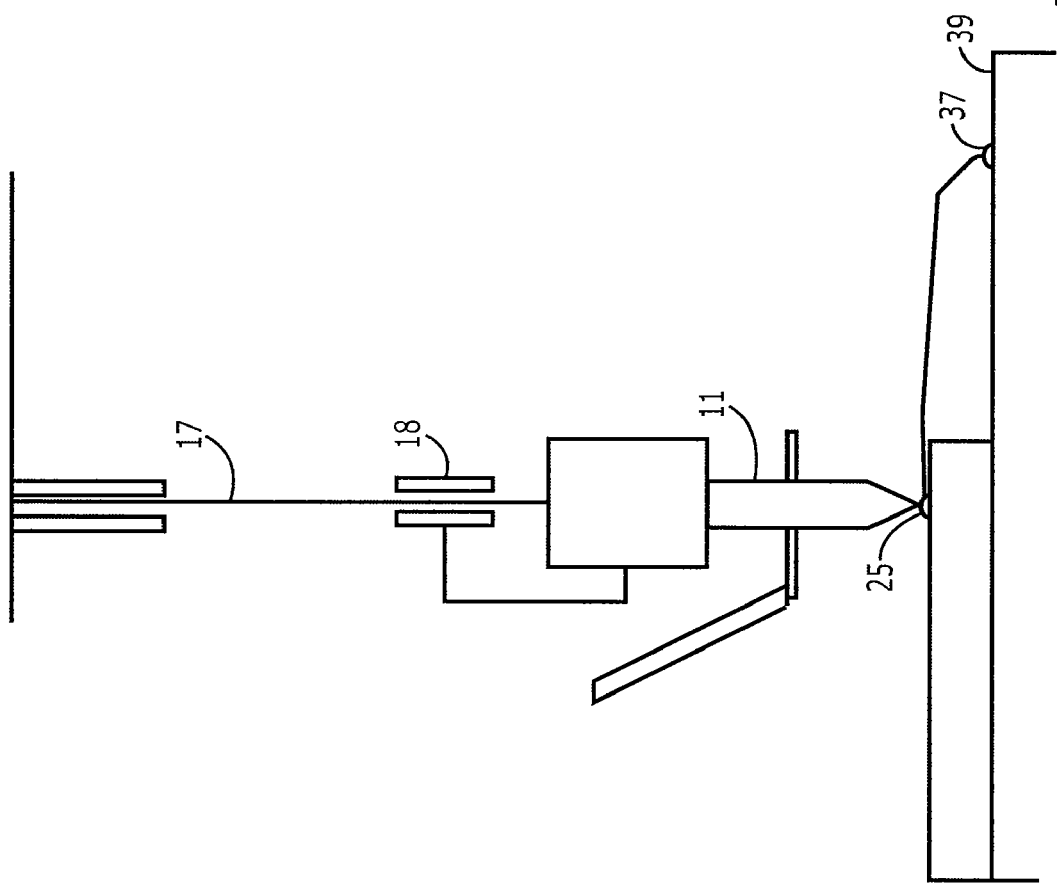

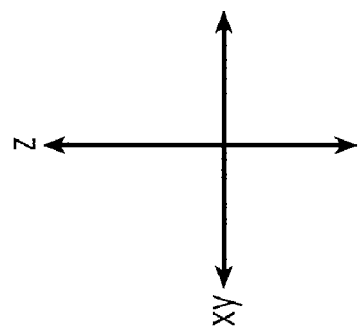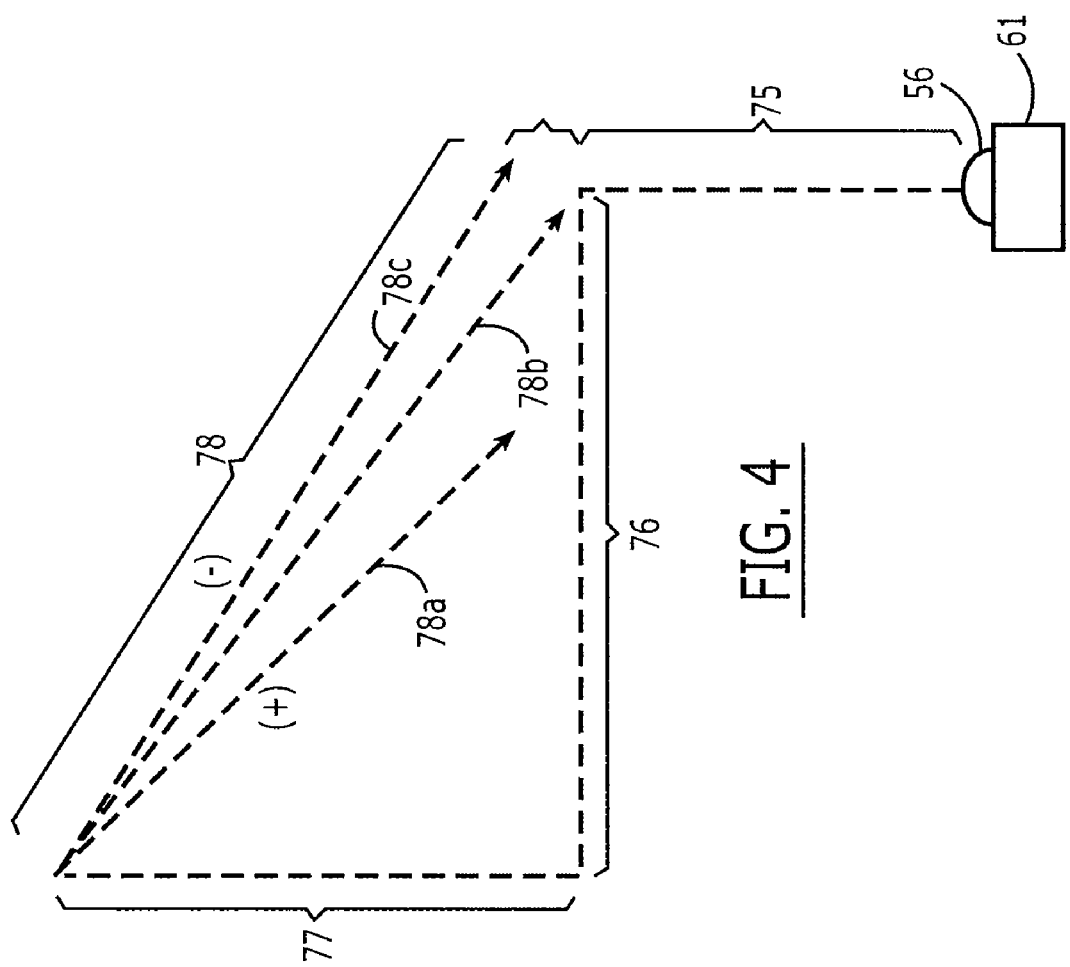
FIG. 4

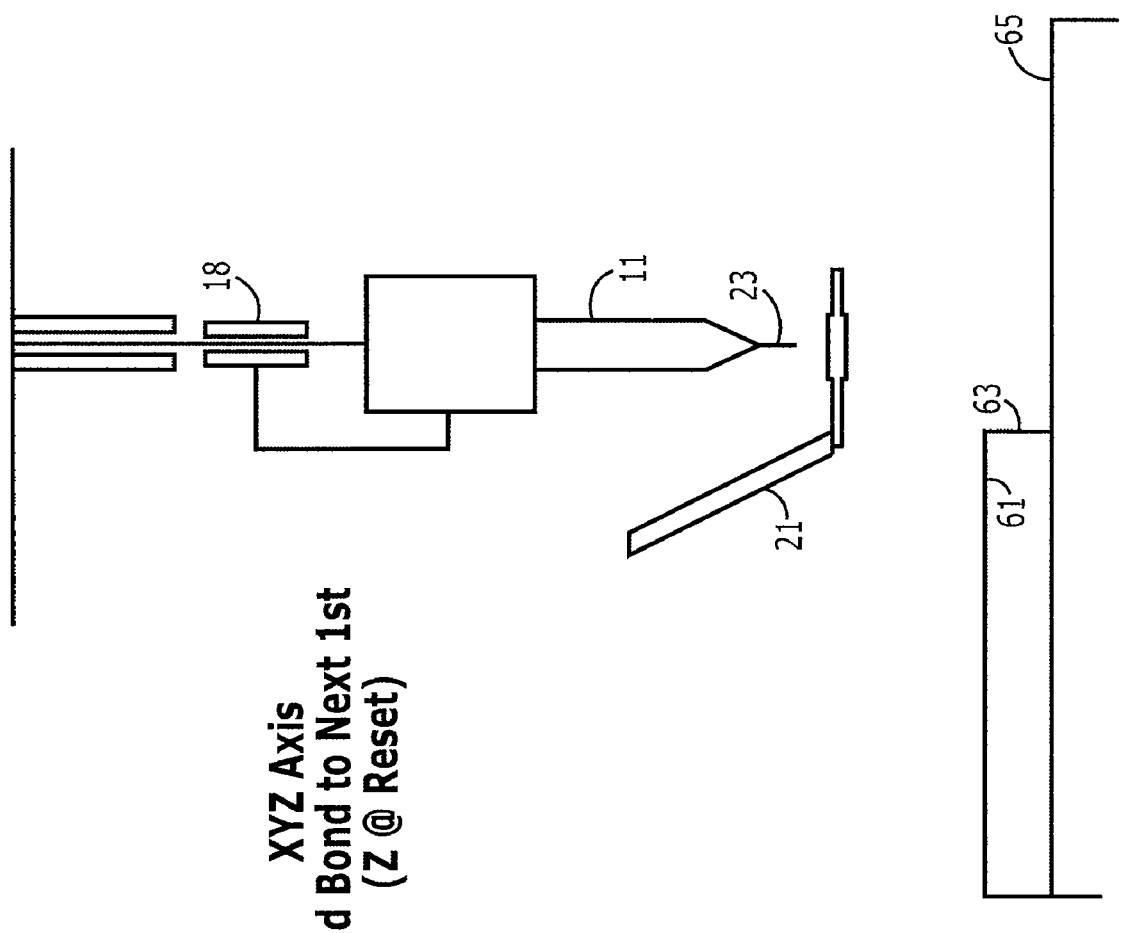

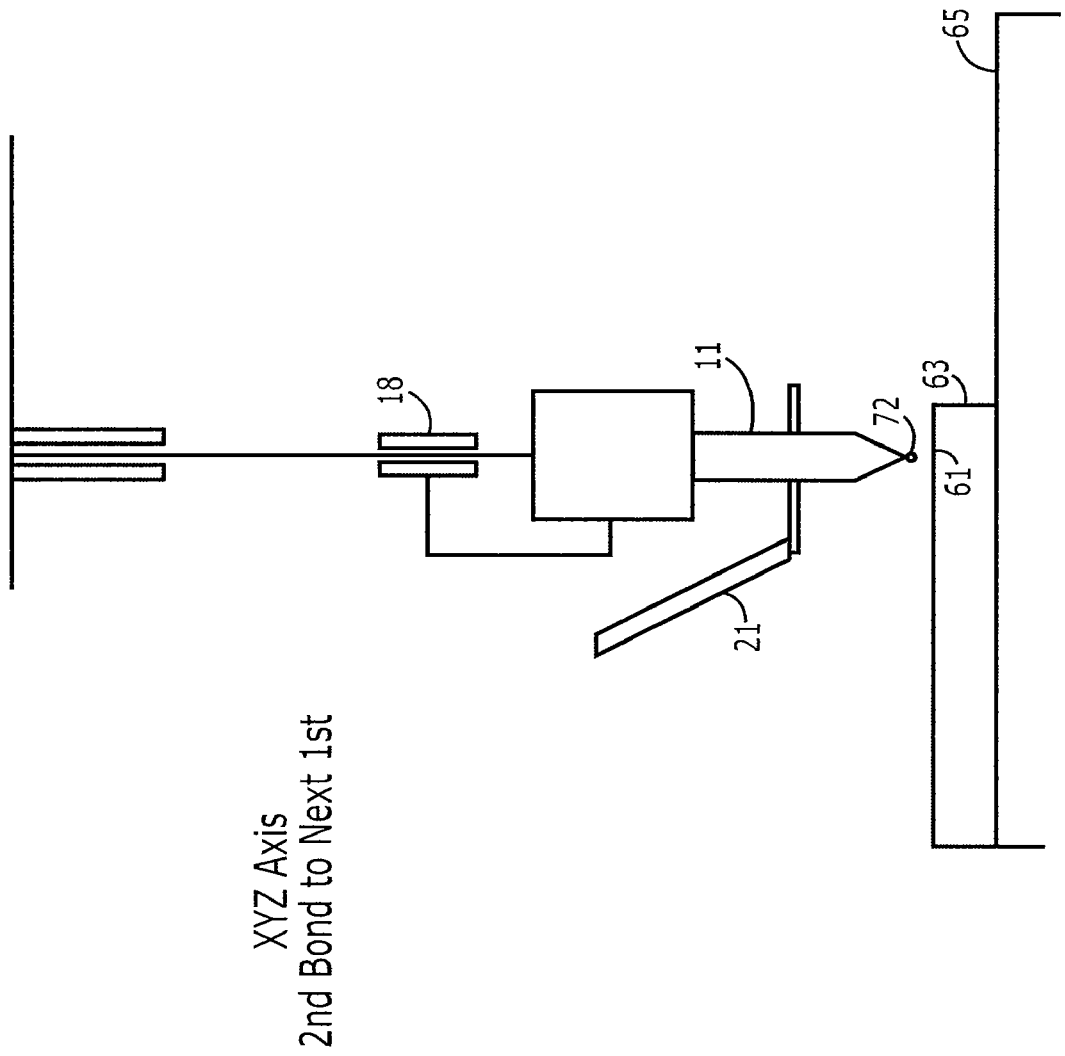

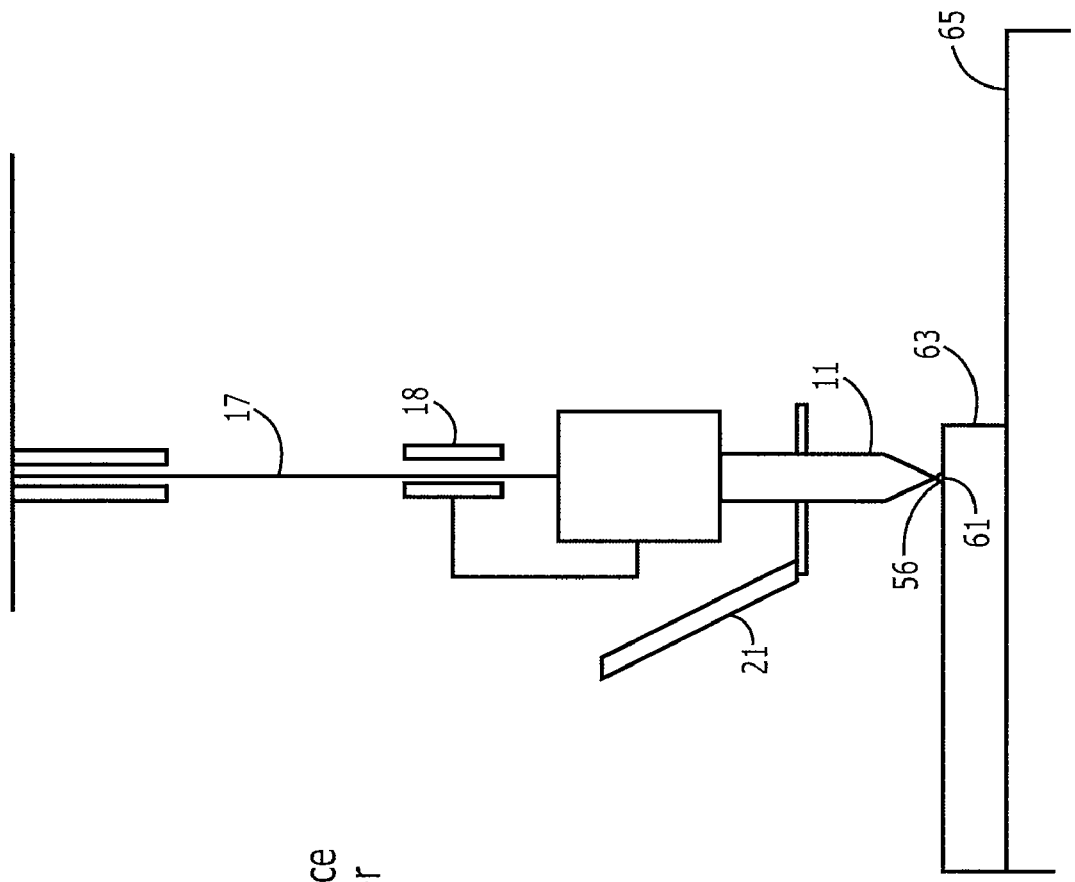

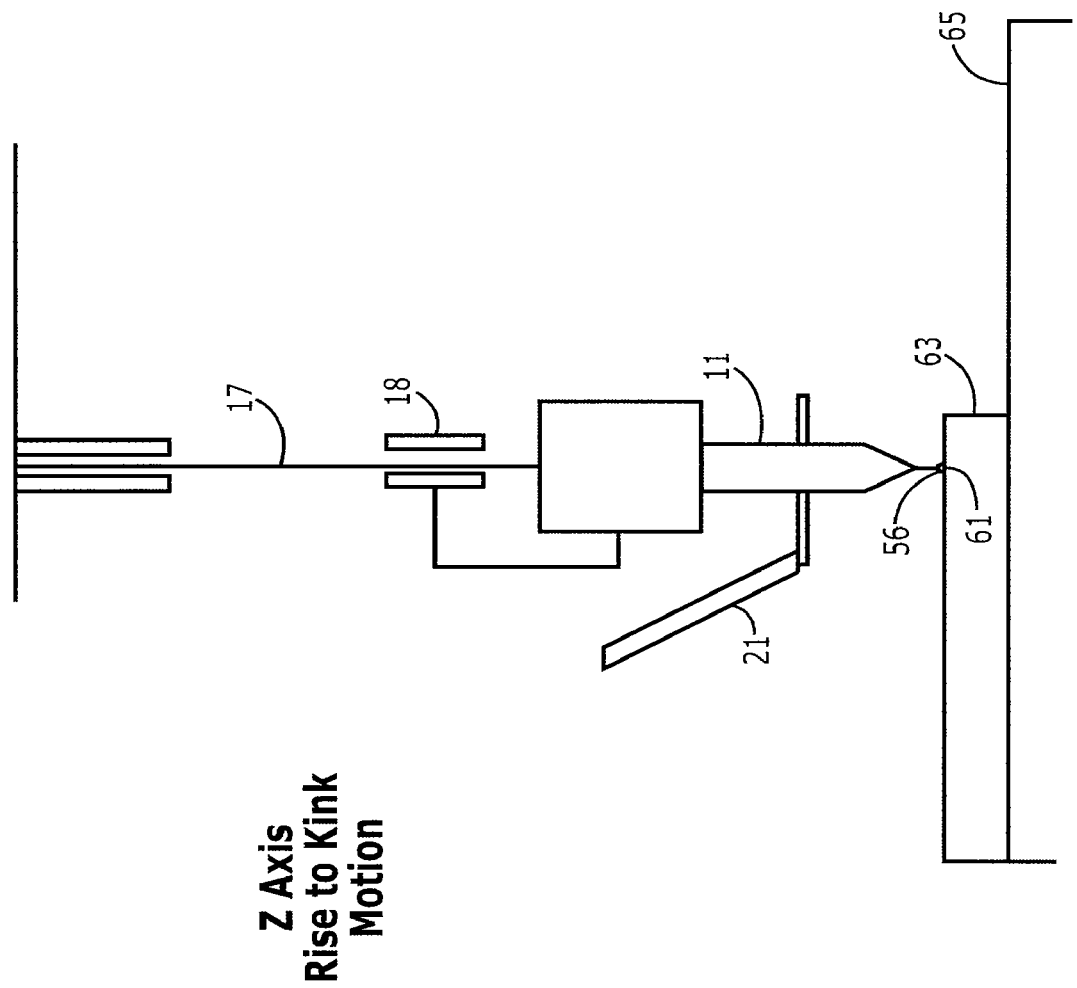

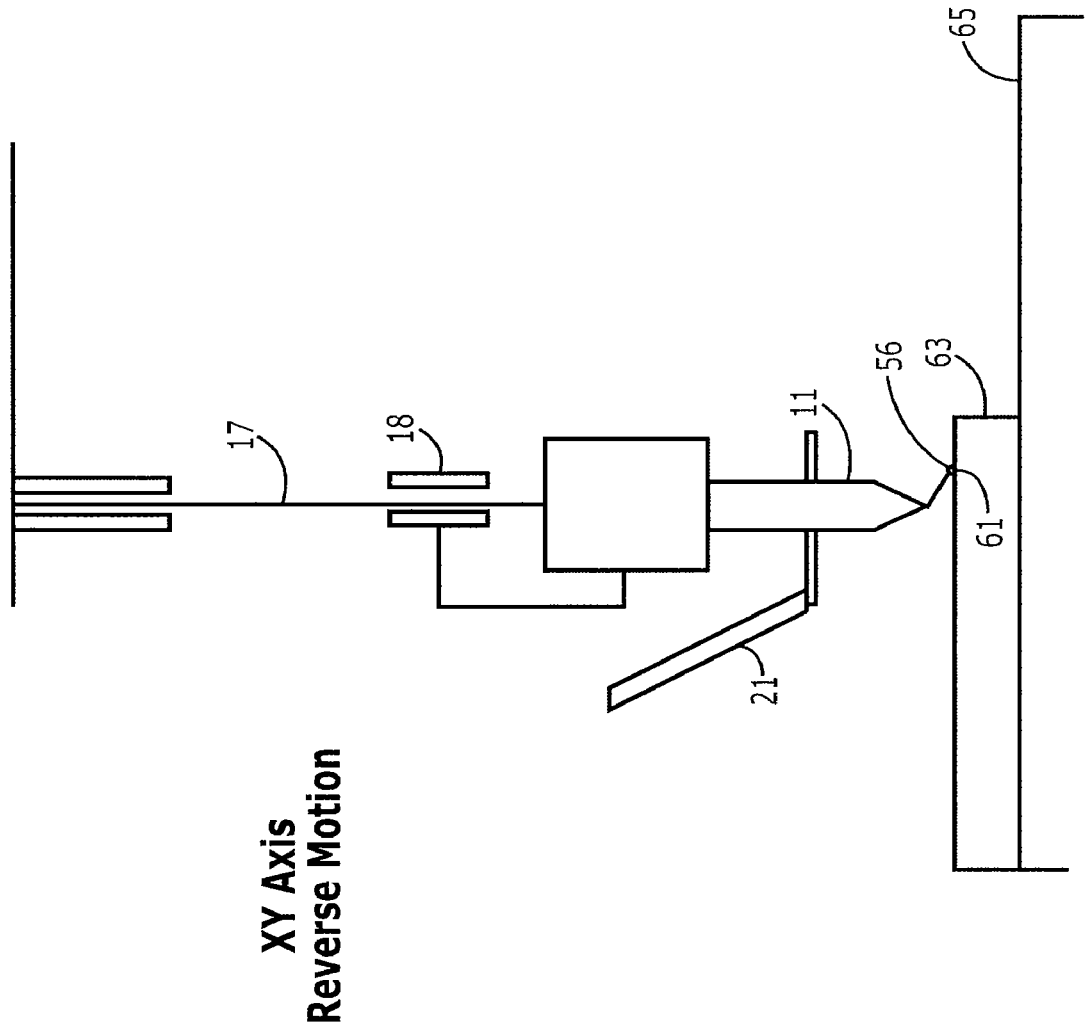

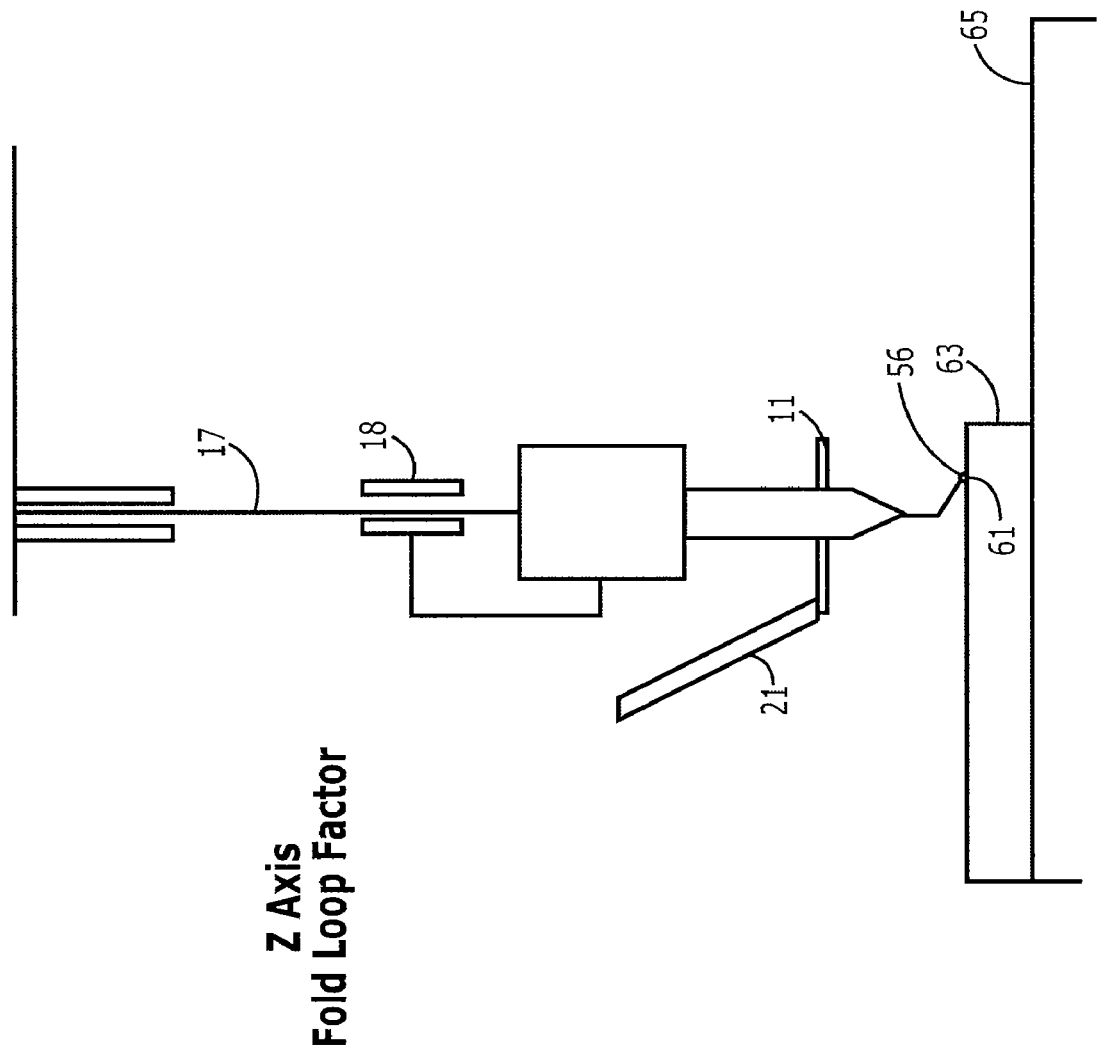

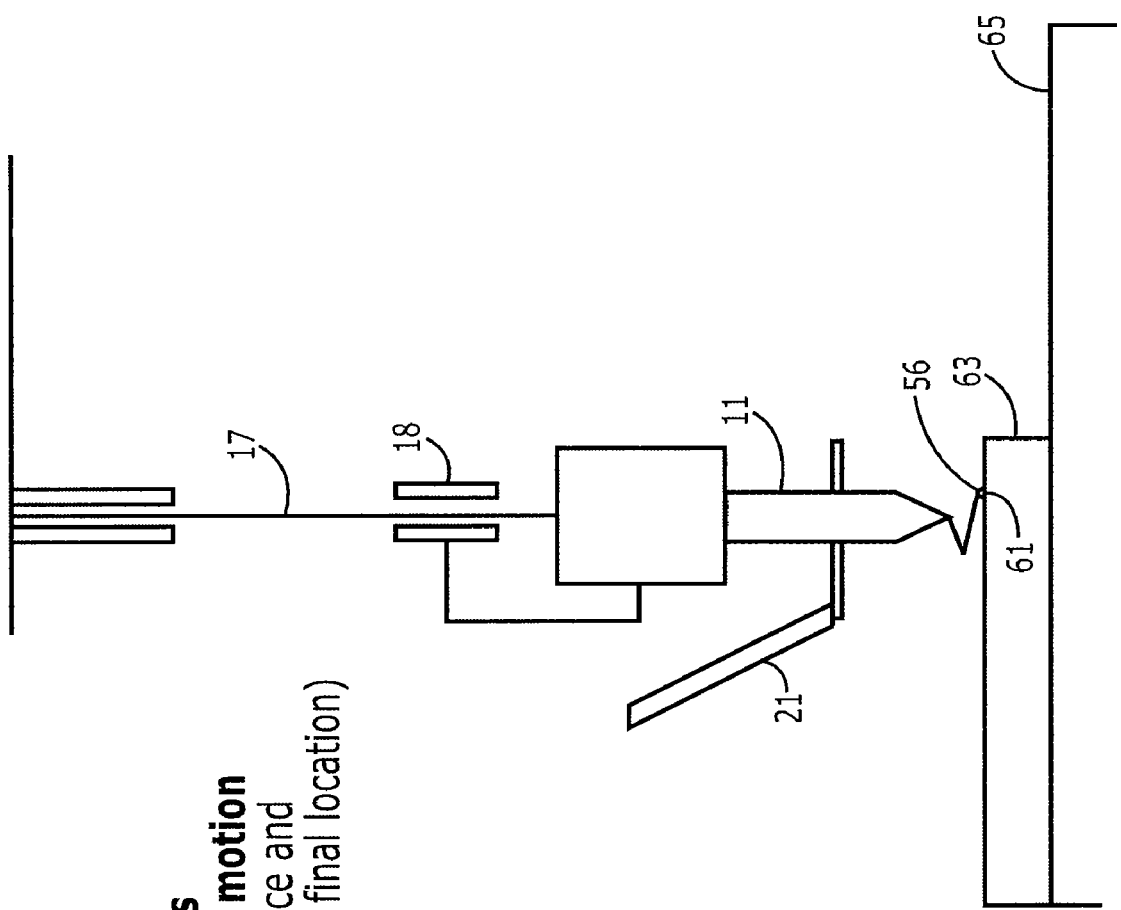

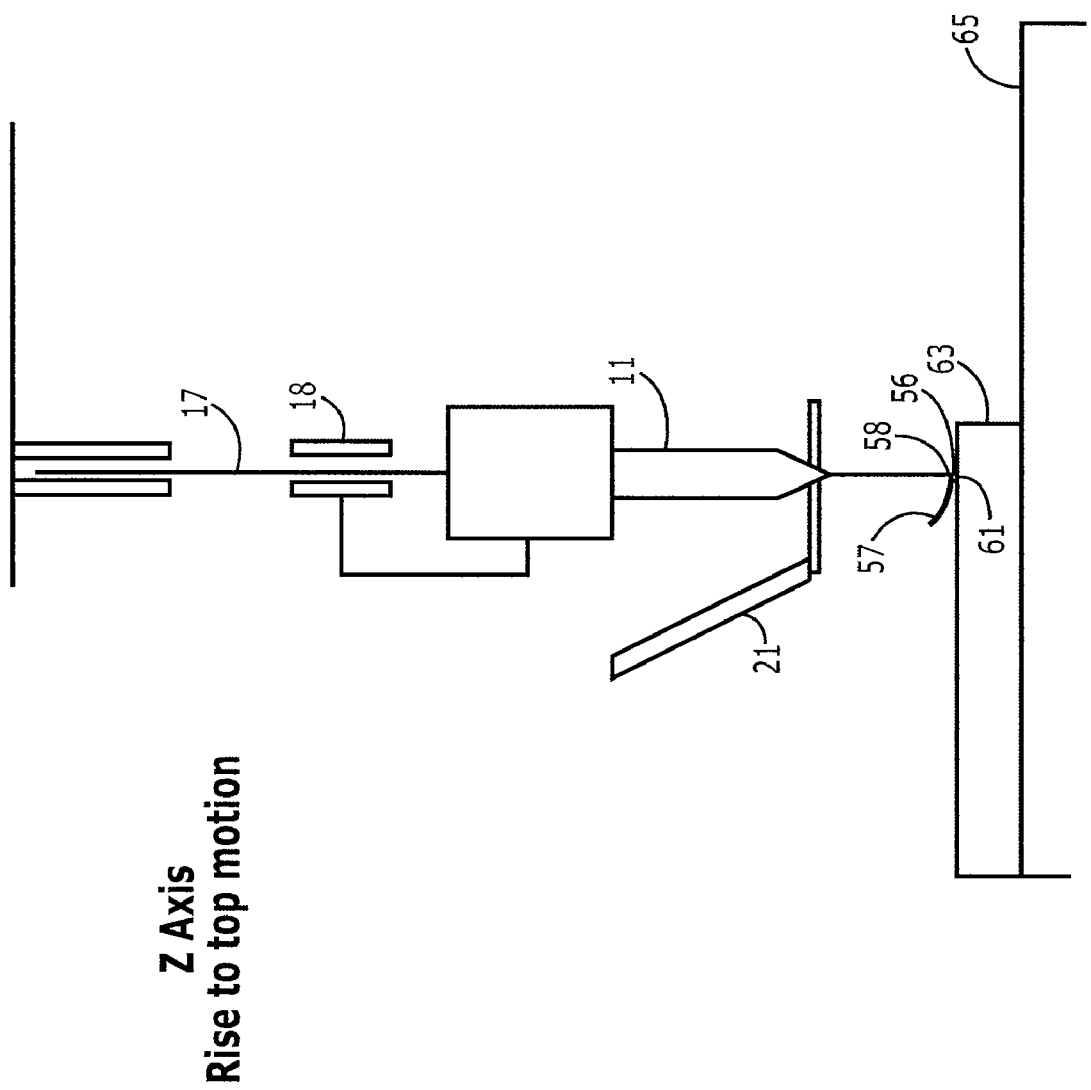

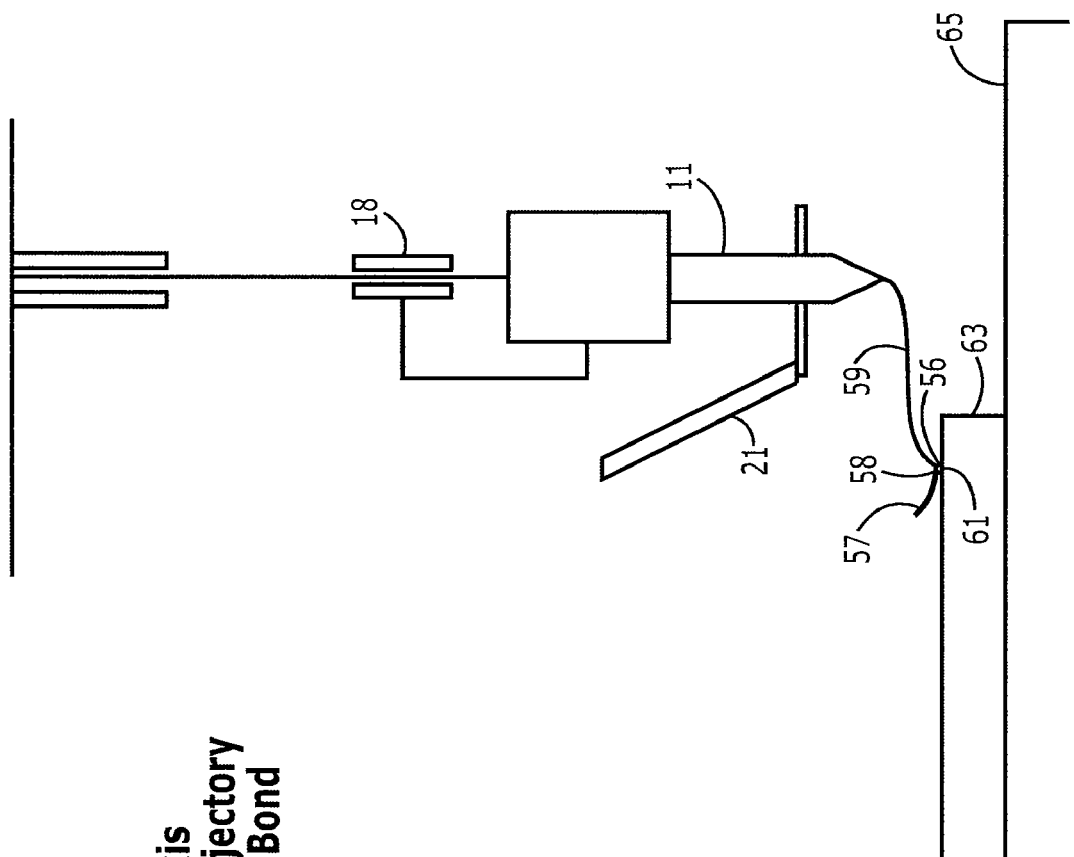

LOW LOOP HEIGHT BALL BONDING METHOD AND APPARATUS

CROSS-REFERENCE TO RELATED APPLICATIONS

This application is a divisional application of U.S. patent application Ser. No. 10/988,053 filed Nov. 12, 2004, now U.S. Pat. No. 7,347,352 which claims priority to U.S. Provisional Patent Application No. 60/525,305 filed Nov. 26, 2003 the content of which is incorporated herein by reference.

FIELD OF THE INVENTION

The invention pertains to wire bonding on semiconductor devices.

BACKGROUND OF THE INVENTION

Ball bonding is a common technique for interconnecting the bond pads on a semiconductor die with the contact points on a lead frame or other substrate on which the die is mounted. Electrical interconnect wires typically are run from the bond pads on the top of the die to lead fingers on a lead frame in order to electrically connect the circuitry on the die to the pins of the lead frame that will extend from the package after the die has been encapsulated. The wire bonds between the bond pads of the die and the lead fingers commonly are formed using a ball bonding machine. FIGS. 1A-1I demonstrate the steps in a conventional technique of ball bonding. The conventional looping technique (herein termed forward looping) involves ball bonding one end of a gold wire to a bond pad on a die and stitch bonding the other end of the wire to the lead frame. More particularly, using a ball bonding machine, the wire 17 is passed through a set of clamps 18 and through a center bore of a capillary 11. At the beginning of the process, a wire "tail" 23 is protruding from the tip of the capillary 11, as shown in FIG. 1A. The tail 23 at the end of the wire 17 is heated by means of an electric spark 16 termed an electric flame off (EFO) from an EFO wand 24. The spark melts the end of the wire, which, in turn, forms into a ball 19 when melted, as shown in FIG. 1B. The clamps 18 are closed during EFO in order to provide a current return path through the clamps and then are opened to allow the ball to seat itself in the capillary tip. The capillary 11 is then moved to a position above the bond pad 13 of the die 15, as shown in FIG. 1C.

The capillary 11 is then moved downwardly with the clamps 18 still open during the initial acceleration of the capillary and then are closed during deceleration of the capillary so that the ball remains seated during the downward motion of the capillary. The clamps then open just before the ball contacts the bond pad 13. The ball 19 comes into contact with the bond pad 13 on the die 15 with the clamps 18 still open, as shown in FIG. 1D. Heat and/or ultrasonic energy are applied to the die to cause the ball to become bonded to the bond pad 13. This bond typically is termed a ball bond or first bond. The capillary 11 is then raised with the clamps 18 opened to pay out a short length of wire that is still attached to the top of the ball bond, as shown in FIG. 1E. Next, with the clamps 18 open, the capillary 11 is moved through a predetermined looping motion with the wire (which is still connected to the ball bond) and trailing out of the capillary 11 to a position generally near and above the lead finger 21. With the capillary 11 positioned above the lead finger 21, the clamps 18 are closed, as shown in FIG. 1F. The capillary 11 is then lowered to pinch the wire between the capillary and the surface of the lead finger 21, as shown in FIG. 1G. Again, heat and/or ultrasonic energy may be applied to bond the pinched portion of the wire to the lead finger 21. This bond is termed a stitch bond or second bond. The clamps 18 are now opened again and the capillary 11 is then raised with the wire still attached to the stitch bond such that an additional wire "tail" 23 pays out of the capillary, as illustrated in FIG. 1H. The clamps 18 are then closed and the capillary 11 is raised further to snap the wire tail 23 at the weakest point, which is at the stitch bond location. The completed connection 22 is termed a wire loop and is illustrated in FIG. 1I.

At this point, the capillary is moved near the next bond pad on the die 15 for commencing the wire looping process for the next bond pad on the die. The wire tail 23 that remains protruding from the tip of the capillary after the conclusion of the formation of the preceding wire loop will be melted by EFO, as previously described, to form the next ball for commencing the next ball bonding operation. The above-described conventional forward ball bonding technique is fast, reliable, and inexpensive. However, it has limitations. Most notably, the minimal loop height is normally over 150 microns. Loop height is defined as the maximum height of the wire above the bonding surface, e.g., the top surface of the bond pad. Attempting to achieve lower loop height can cause neck damage to the wire loop. The neck is the portion of the wire loop directly adjacent to the ball bond. Reducing the loop height below 150 microns tends to weaken or break the neck.

There is an increasing demand for smaller and smaller integrated circuit packaging. One of the significant aspects of reducing the size of the integrated chip packaging is reducing its thickness or height. The thinner packages are generally referred to in the trade as low profile packages. Commensurate with the desire to reduce the height of the package is the desire to reduce the height of the highest point of the wire loops, which, in many instances, is the limiting factor as to the height of an integrated circuit package.

In order to reduce loop heights for integrated circuit packaging and other purposes, a wire looping technique known as reverse looping was developed. The premise behind reverse looping is that, because the highest point of the wire loop is adjacent the ball bond, it would be desirable reverse the looping process so as to make the first, ball bond on the lead frame (or other substrate) and make the second, stitch bond on the bond pad of the die because the surface of the lead frame is lower than the surface of the die. Hence, the highest point of the wire loop is near the lower bonding surface, thus reducing the overall height.

However, simply reversing the direction of the looping process would not be possible because, the stitch bond requires the capillary to come in contact with the bonding surface. The bond pads on a die usually are very small and, thus, it is difficult to make a stitch bond on a bond pad on a die without the capillary contacting and, hence, damaging surrounding circuitry on the die. Furthermore, the wire loops tends to sag to their lowest points close to the stitch bond. Thus, if the stitch bond site is higher than the ball bond site, the wire might contact the edge or the top surface of the die. This could lead to electrical shorts or breakage of the wire.

Thus, a reverse looping technique was developed, such as illustrated in FIGS. 2A through 2C, in which the first step is to form a ball bond 25 on top of the bond pad 27 on the die 29 essentially in accordance with standard techniques for forming ball bonds. However, instead of paying out the wire 17 as would be the case after making the ball bond in a conventional forward looping technique, the capillary 11 is raised, the clamps 18 are closed, and the capillary is raised further to snap the wire off from the ball bond leaving just the ball bond (or bump) 25 on the bond pad 27, as illustrated in FIG. 2A. Then a complete wire looping process is performed in the reverse direction, i.e., from the substrate to the bond pad. That is, a second ball bond 37 is then formed on the lead frame 39, the capillary 11 is then moved through a series of motions to a position above the first ball bond 25 to create the desired wire loop shape, as illustrated in FIG. 2B. Then, a bond 43 is formed on top of the first ball bond (or bump) 25. The completed wire loop is illustrated in FIG. 2C.

This reverse looping process can provide low loop heights for low profile packaging. However, it is a much slower process than forward looping because it requires the formation of two ball bonds per loop. Furthermore, the die must suffer greater impact because the capillary must form a bond on the die twice per wire loop (i.e., once to create the first ball bond and a second time to create the bond on top of the ball bond). Another limitation of reverse looping is that it often is the limiting factor on how fine the pitch of the bond pads on the die. Particularly, the bump 25 on top of the die bond pad must be large enough to provide support for a bond. In addition, the diameter of the bump will increase in the lateral direction when the bond is made on top of it.

Accordingly, it is an object of the present invention to provide an improved wire loop formation method and apparatus.

It is another object of the present invention to provide a wire loop interconnect with very low loop height.

SUMMARY OF THE INVENTION

In accordance with the invention, a bump is formed on the die bond pad by forming a ball bond thereon. Then, without severing the wire and with the clamps open, the capillary undergoes a set of coordinated xyz motions to fold the wire on top of the ball bond. Then the wire is bonded on top of the bump without breaking off the tail. This is followed by a further set of coordinated xyz motions to bring the capillary to the second bond site (e.g., the lead frame or other substrate) and perform a, stitch bond on the substrate and then break off the tail to complete the process.

In accordance with one particular embodiment of the invention for making the aforementioned wire fold, the ball bond is made and then the capillary is raised in the z direction a designated height (herein termed the separation height). It is then moved horizontally (in the xy plane) a specified distance in a direction generally away from the second bond location (herein termed the fold offset distance). The capillary may or may not be raised again in the z direction by another distance (herein termed the fold factor). This is followed by another motion in the xy plane to generally bring the capillary back to the top of the bump for formation of the aforementioned bond on top of the bump. This is then followed by another coordinated xyz motion to bring the capillary to the location of the second bond site (e.g., on the lead frame) where the stitch bond will be made.

BRIEF DESCRIPTION OF THE DRAWINGS

FIGS. 1A through 1I are elevation views illustrating the steps of a conventional forward looping operation.

FIGS. 2A through 2C are elevation views illustrating steps of a reverse looping operation.

FIG. 4 is a pictorial elevation view showing the various components of the set of xyz motions involved in forming a folded bump in accordance with the present invention.

DETAILED DESCRIPTION OF THE INVENTION

Figure 1B:
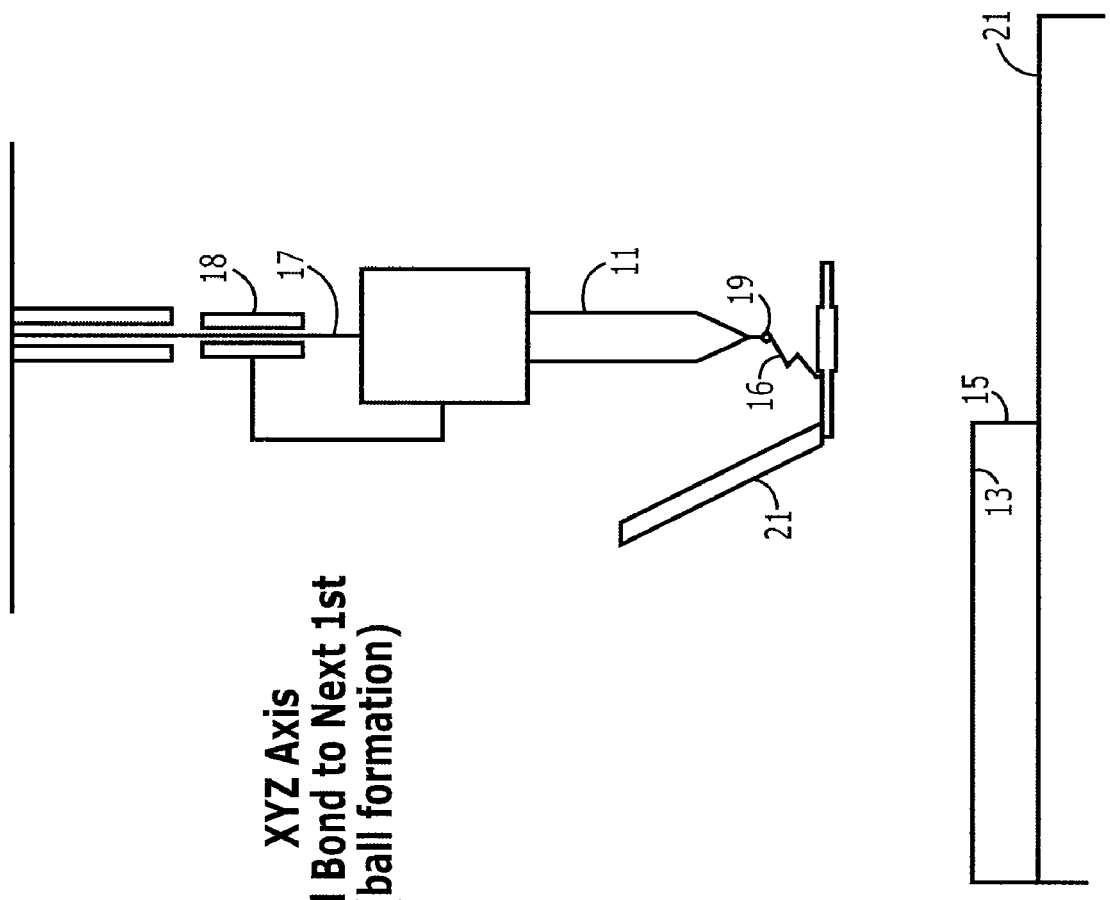
Figure 1C:
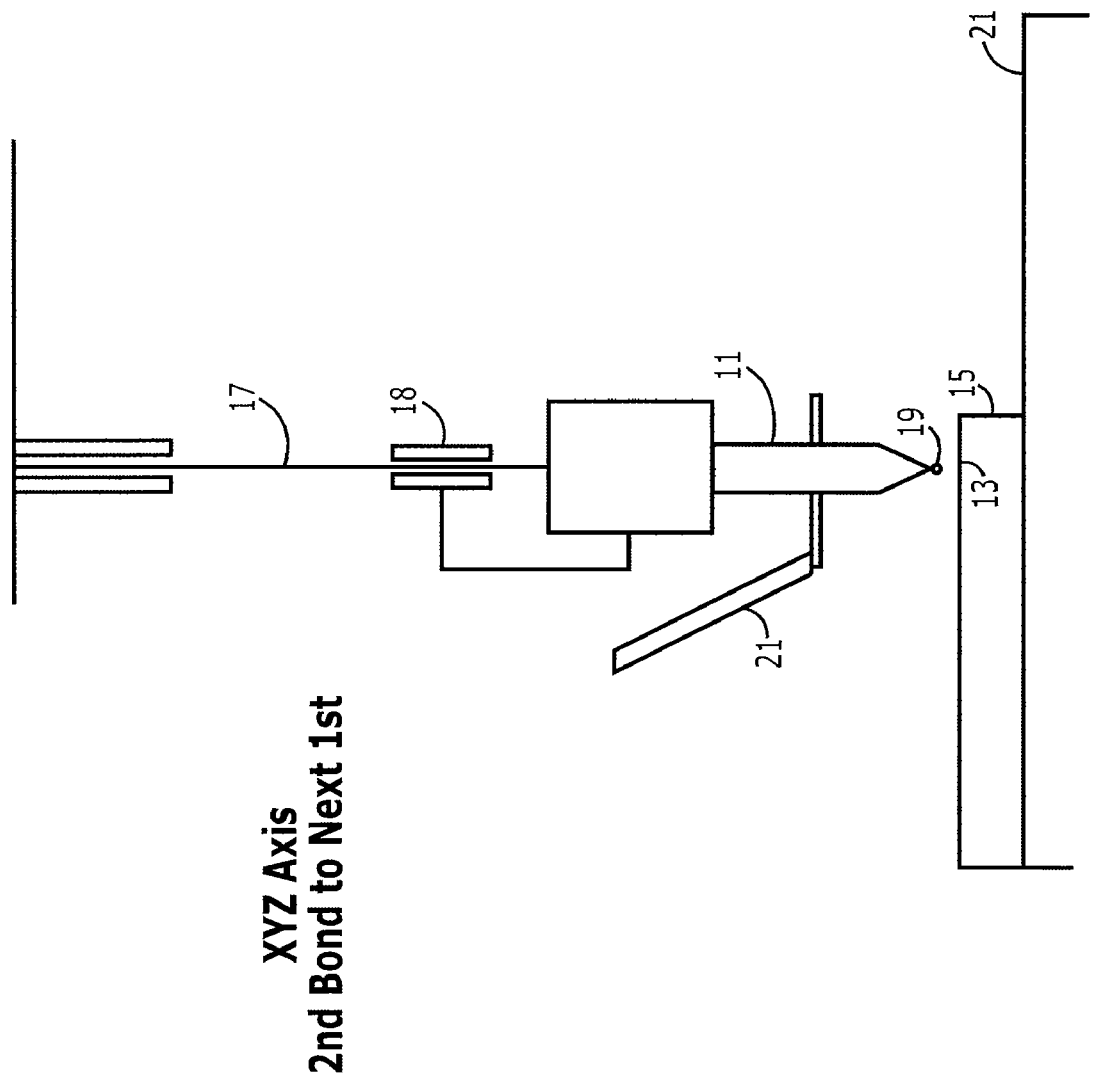
Figure 1D:
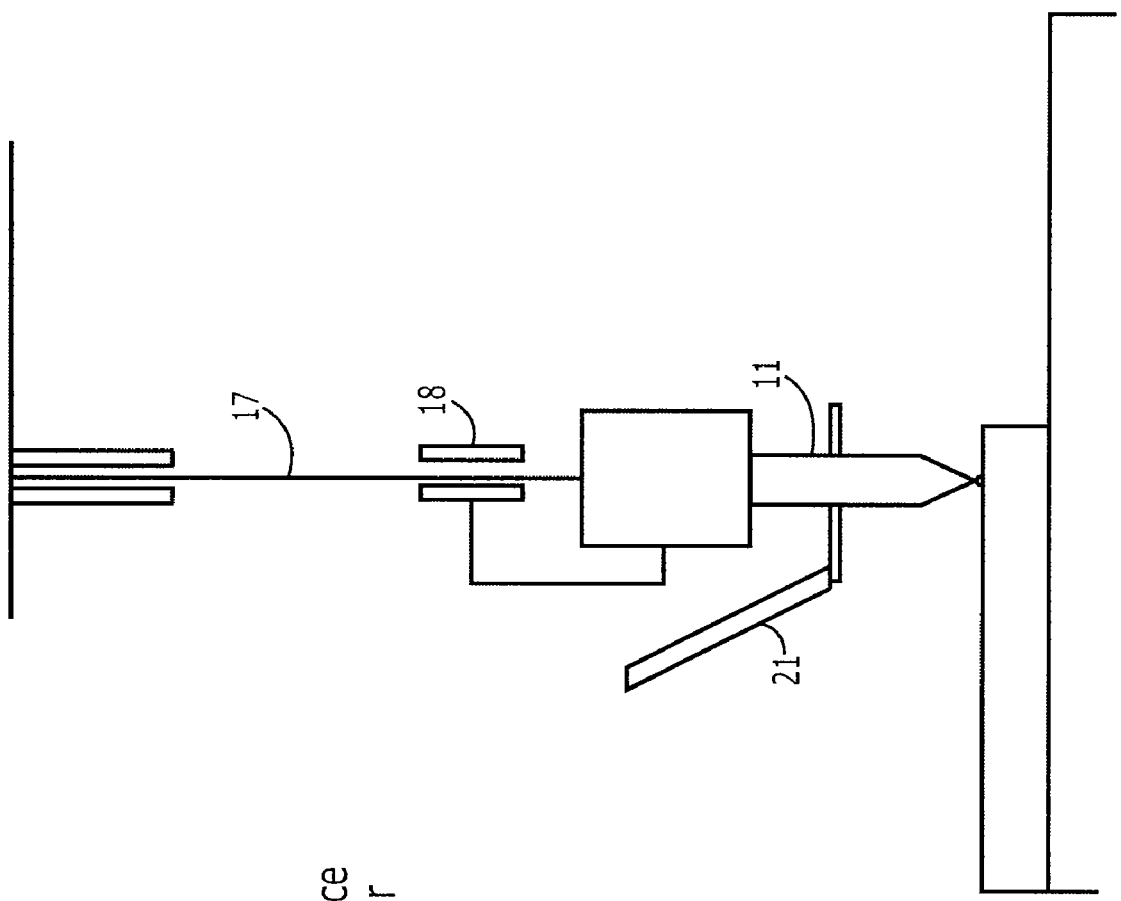
Figure 1I:
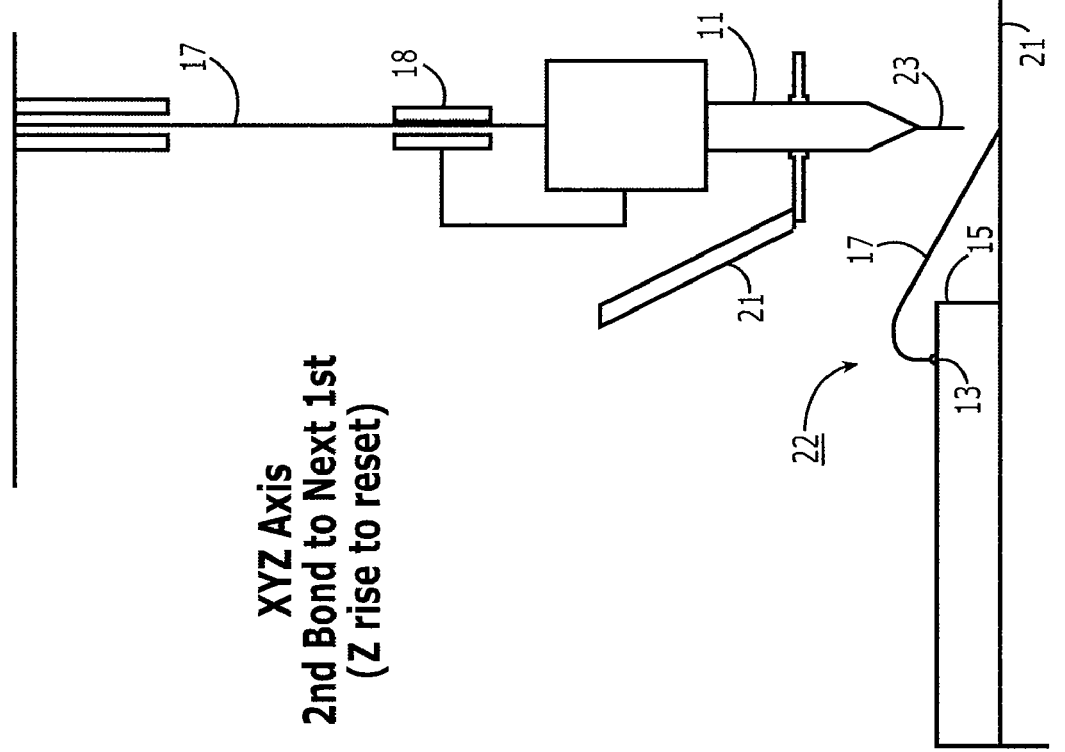
Figure 2A:
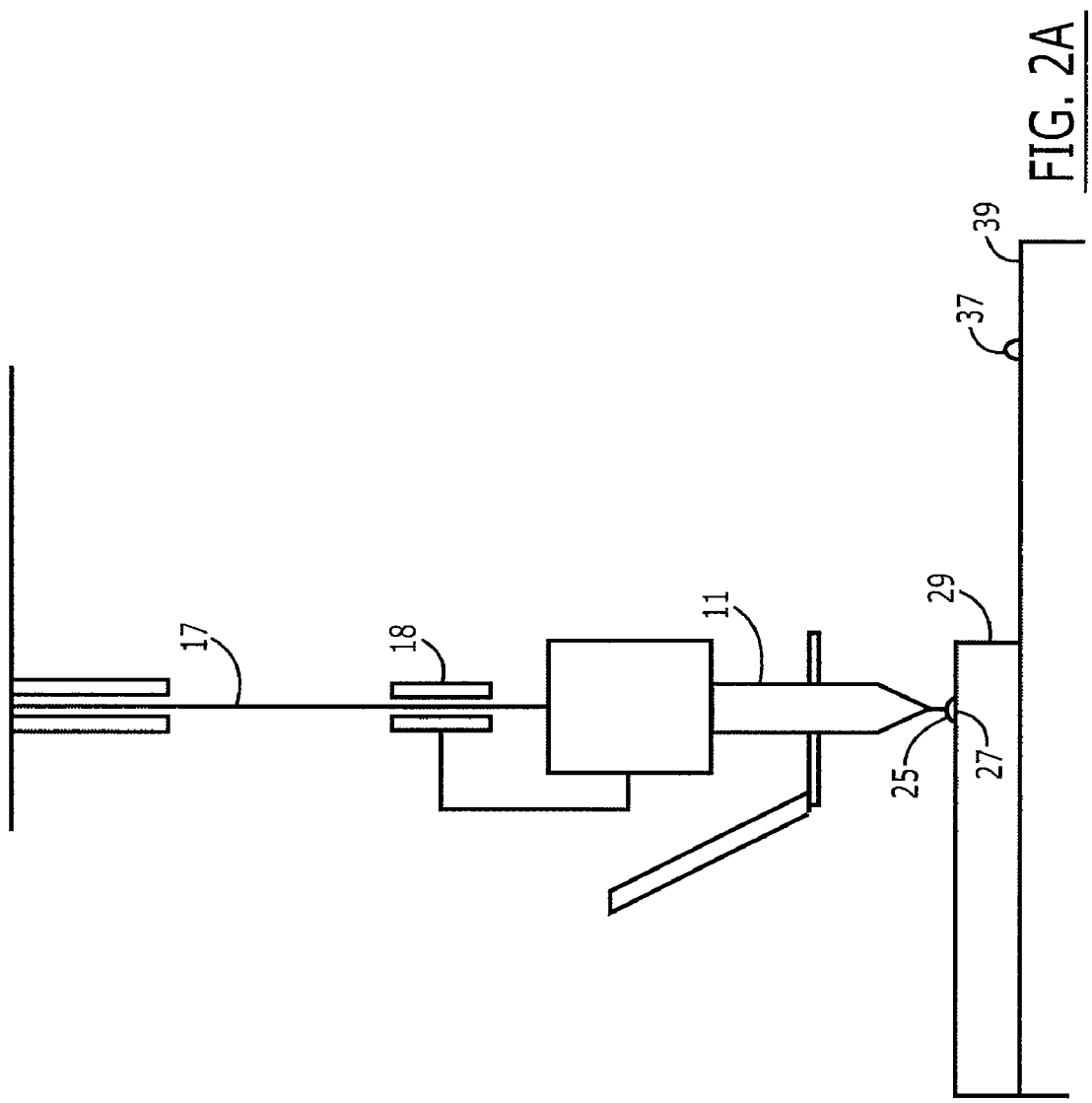
Figure 3:
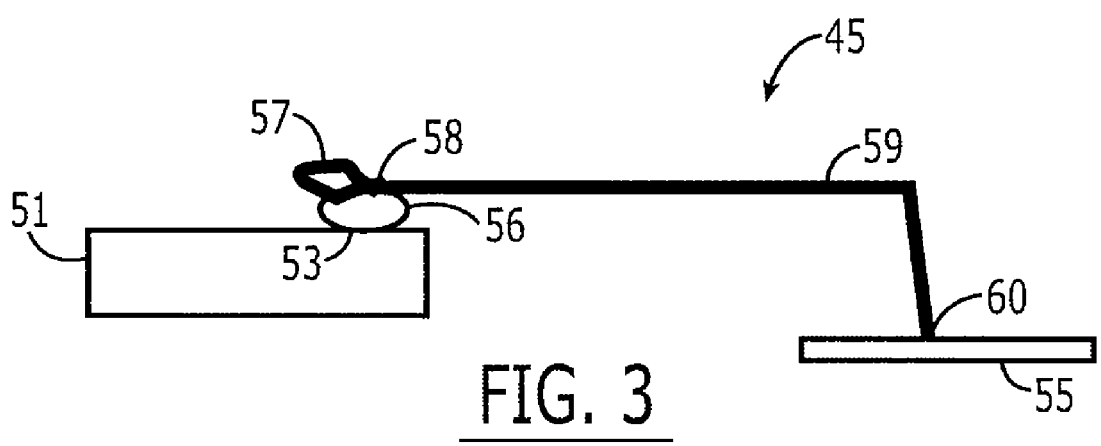
FIG. 3 is a pictorial elevation view of a folded wire loop interconnect in accordance with the present invention.

FIG. 3 is a side elevation pictorial of a folded forward wire loop 45 formed in accordance with the present invention. FIG. 3 shows an integrated circuit die 51 including a bond pad 53 on its top surface and a lead frame substrate 55 with a wire loop interconnect between the bond pad 53 and the lead frame 55. The wire loop 45 is formed in accordance with the technique of the present invention may be considered to comprise five general components. With reference to FIG. 3, they are (1) a bump 56, (2) a wire fold 57 on top of the bump, (3) a bond on top of the bump 58, (4) a wire loop 59 that interconnects the first and second bond sites, and (5) a stitch bond 60 at the second bond site.

The five general components described above may be formed using a ball bonding machine.

FIGS. 5A through 5O illustrate the position of the capillary of the ball bonding machine and the condition of the wire at various stages of an exemplary process for forming a folded forward wire loop in accordance with one particular embodiment of the present invention. In the terminology used in this specification, the vertical direction is termed the z direction and the horizontal direction is termed the xy direction. The Figures in this application are, of course, two dimensional so that all xy motions are illustrated as being in the plane of the page and thus could be considered simply as one dimensional movements, i.e., x or y, rather than xy. However, because, in the real world, the wire loops on a given die are not all parallel to each other, all lateral motion must be defined as xy motions in the machine code that controls the motion of the capillary of a ball bonding machine. Thus, we use the same terminology in this specification. In addition, the terms vertical and horizontal are merely exemplary based on the assumption that the top surface of the die is oriented horizontally, which is typical, but not necessarily always an accurate assumption.

As shown in FIG. 5A, the folded forward loop formation process begins with the capillary 11 at the end of the preceding looping process with a wire tail 23 extending from the capillary and the clamps 18 closed. The capillary is positioned in the vicinity of the bond pad 61 of the die 63 and the associated lead finger 65 between which the next wire loop interconnect is to be made.

Figure 5B:
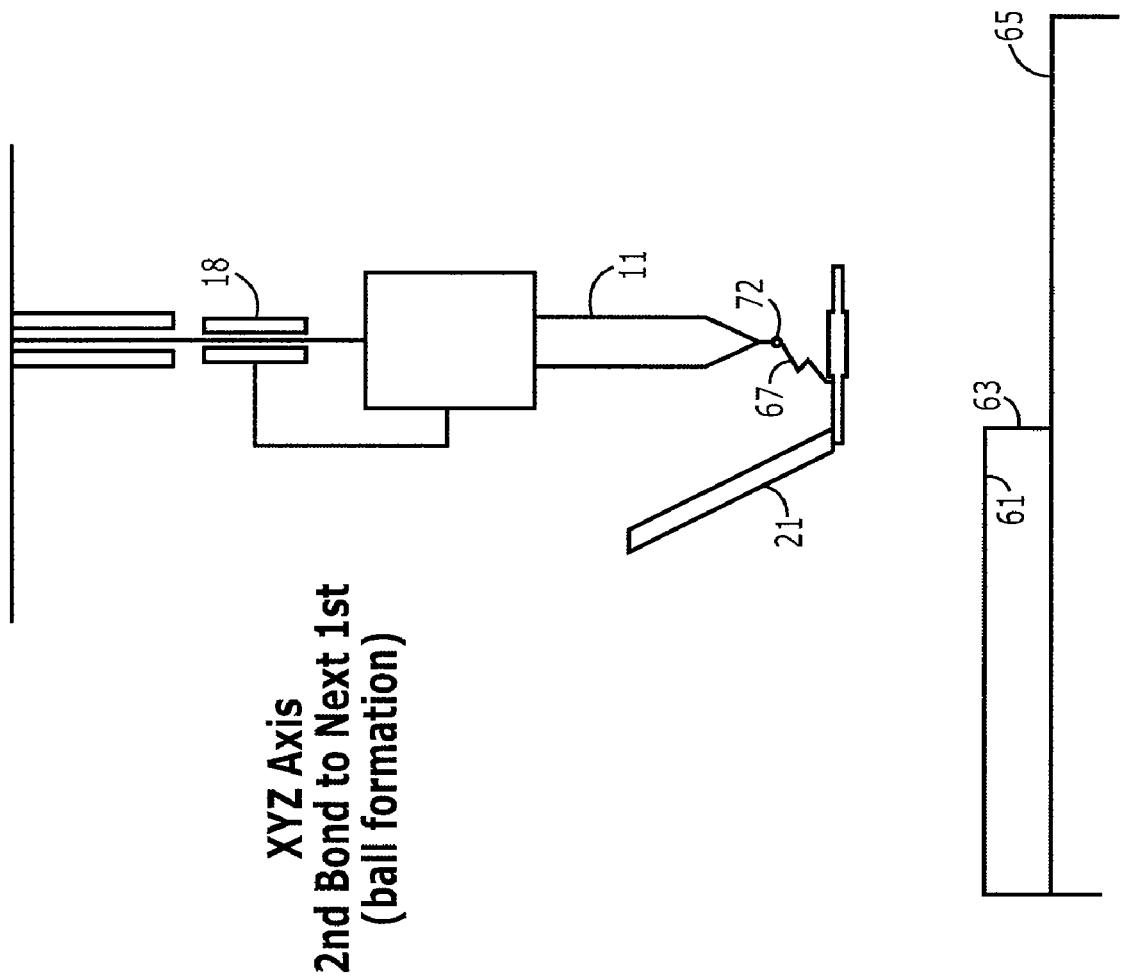
FIGS. 5A through 5O are elevation views illustrating the steps of a folded forward looping operation in accordance with the present invention.

The wire is melted with the electric-flame-off 67 to cause the end of it to melt. Upon melting, it inherently forms into a ball 72, as shown in FIG. 5B. The capillary is lowered and moved toward the bond pad 61, as shown in FIG. 5C. The capillary is then lowered to contact the ball 72 against the bond pad 61. Heat and/or ultrasonic energy is applied to bond the ball to the bond pad. FIG. 5D shows the process at this point, which essentially is the end of the formation of the first portion of the folded forward wire loop, i.e., the bump 56.

Next, the capillary 11 rises with the clamps 18 open in order to pay out a length of wire extending from the top of the bump 56. The distance of this rise is herein termed the separation height, and is illustrated at 75 in FIG. 4. FIG. 5E shows the capillary position after this step. The capillary 11 then moves in the xy plane in a first direction generally opposite the direction to the second bond site 65 (to the left in FIGS. 5A through 5O). Preferably, the direction of the fold offset is exactly opposite the xy direction toward the second bond site 65, however, it can be in any direction. In fact, there may be cases in which it is zero. The distance of this xy motion is herein termed the fold offset and is shown in FIG. 4 at 76. The position of the capillary after the fold offset motion is shown in FIG. 5F.

In some embodiments of the invention, at the end of the fold offset motion, the capillary 11 is raised again (in the positive z direction) a short distance (herein termed the fold factor) to pay out additional wire. The fold factor is shown at 77 in FIG. 4. However, in some applications of the invention, a fold factor of zero will be adequate. FIG. 5G shows the position of the capillary and wire at this point in the process. The fold offset and the fold factor control the amount of wire in the wire fold.

The capillary 11 is then moved back toward the bump 56 to fold the wire back over on top of itself to begin forming the wire fold on top of the bump. FIG. 5H shows the position of the capillary 11 and the condition of the wire as the capillary is moving to form the fold. This last-mentioned motion is herein termed the fold return motion as is illustrated at 78 in FIG. 4. Preferably, the fold return motion is in the xy direction exactly opposite the xy direction of the fold offset motion. In those embodiments in which the fold factor 77 is zero, the fold return motion preferably is a purely horizontal (i.e., xy) motion. If the fold factor 77 was not zero, the fold return motion 78 may include a negative z component to return the capillary to the same height that it was during the ball bonding. Either case returns the capillary to the separation height at the end of the fold return motion. However, this is not a requirement. In fact, in at least some preferred embodiments of the invention, as discussed further below, the capillary returns to a height below the separation height In fact, the fold return motion 78 may include a positive (upward) or negative (downward) z component, even if the fold factor 77 was zero. The important aspect is that a wire fold is formed on top of the bump 56 preferably extending in a direction directly away from the second bond site 65. The difference between the separation height and the position of the capillary at the end of the fold return motion 78 is herein termed the bump height. It may be a positive or a negative number. However, as noted previously, in some implementations of the invention, there will be no z motion of the capillary between reaching the separation height and completion of the wire fold and/or the fold factor and the z component of the fold return motion will be exactly equal and opposite so that the bump height will be zero.

Furthermore, the horizontal component of the fold return motion 78 need not be the same distance as the fold offset motion. Depending on the particular application, it may be desirable to return to a position for purposes of performing the bond at a position that is short of (as illustrated by path 78a in FIG. 4), exactly the same as (as illustrated by path 78b in FIG. 4), or long of (as illustrated by path 78c in FIG. 4) the original xy coordinates of the capillary prior to the fold offset motion.

In those rare embodiments in which the fold offset is zero, the horizontal component of the fold return motion also may be zero or very small. However, it need not be since, as just noted, it may be desirable in certain circumstances that the bond on top of the bump be made short of or long of the original xy coordinates of the capillary prior to the fold offset motion (i.e., the original xy coordinates of the capillary when it made the bump when it made the bump). Generally, however, there should be at least either a non-zero offset motion or a non-zero horizontal component to the fold return motion in order to cause the loop to form in some specified direction. In the absence of both, the direction of the fold that the wire takes may be unpredictable and/or may vary from bond to bond. In the absence of any significant horizontal motion in both the fold offset motion and the offset return motion, there may be no folded loop formed at all or a negligible one. This may actually be desirable in some circumstances.

The horizontal difference between the xy coordinates of the capillary at this point relative to the xy position of the capillary when the bump was formed is termed the fold return offset. In other words, the fold return offset is the difference in the xy dimension between the fold offset motion and the horizontal component of the fold return motion. If the xy component of the fold return motion 78 is less than the fold offset motion 76, the fold return offset is represented as a positive number. If the horizontal component of the fold return motion 78 is longer than the fold offset motion 76, the fold return offset is represented as a negative number. If the fold offset motion 76 and the fold return motion 78 have the same xy (i.e., horizontal) magnitudes, then the fold return offset is zero.

Figure 5I:
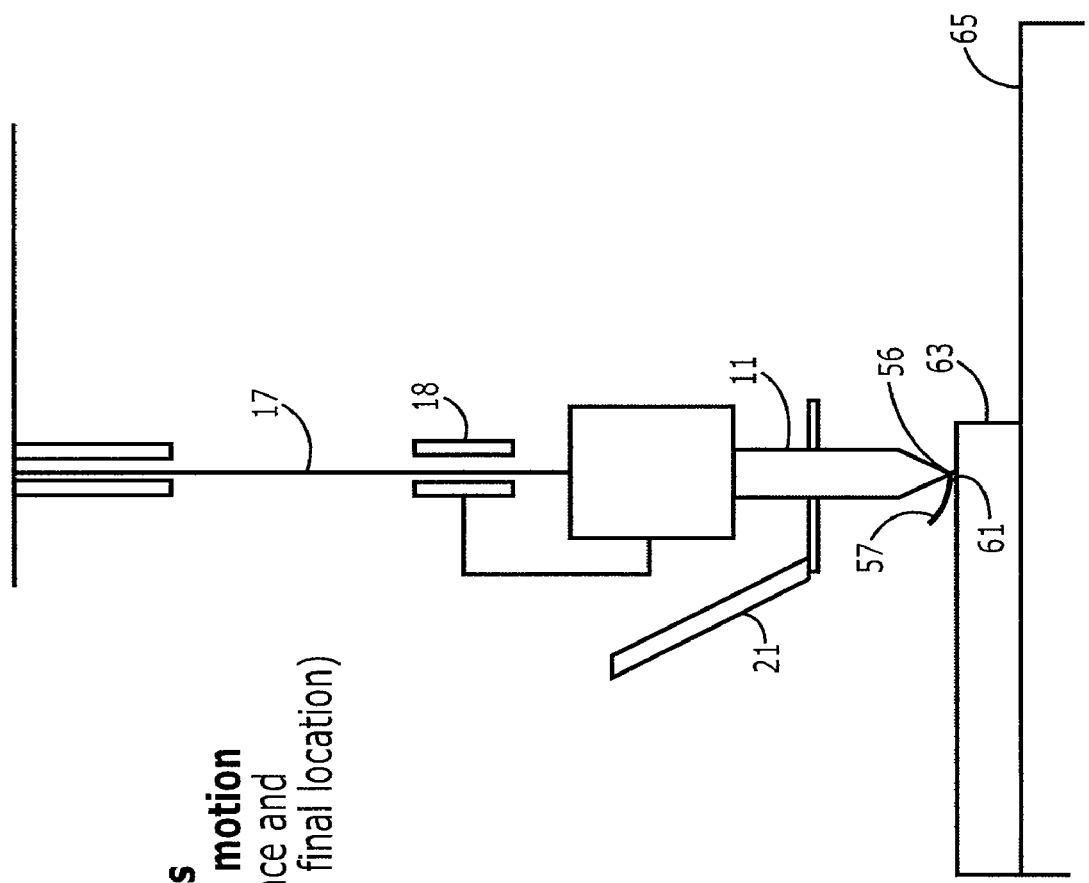

At the end of the fold return motion, the capillary is contacting the top of the bump 56 and pinching the wire between the tip of the capillary 11 and the bump, as shown in FIG. 5I. At this point, the wire has been pinched, but not severed. Also, at this point, the second of the five aforementioned portions of the overall folded forward wire loop (i.e., the fold 57) is completed. As the wire has not been severed since the beginning of the process, the fold 57 is continuous with the bump 56.

The wire is then bonded to the top of the bump 56. Heat and/or ultrasonic energy may be applied to facilitate bonding of the compressed portion of the wire to the top of the bump 56. However, the bonding process need comprise nothing more than simply pinching the wire between the tip of the capillary and the ball without severing the wire. One may call this bond a stitch bond or a stitch-like bond, but the wire should not be severed. At this point, the third of the five aforementioned portions of the overall loop (i.e., bond 58) is completed. FIG. 5J shows the process at this point, which is essentially the same position as shown in FIG. 5I since the capillary typically does not move during bonding.

Figure 5L:
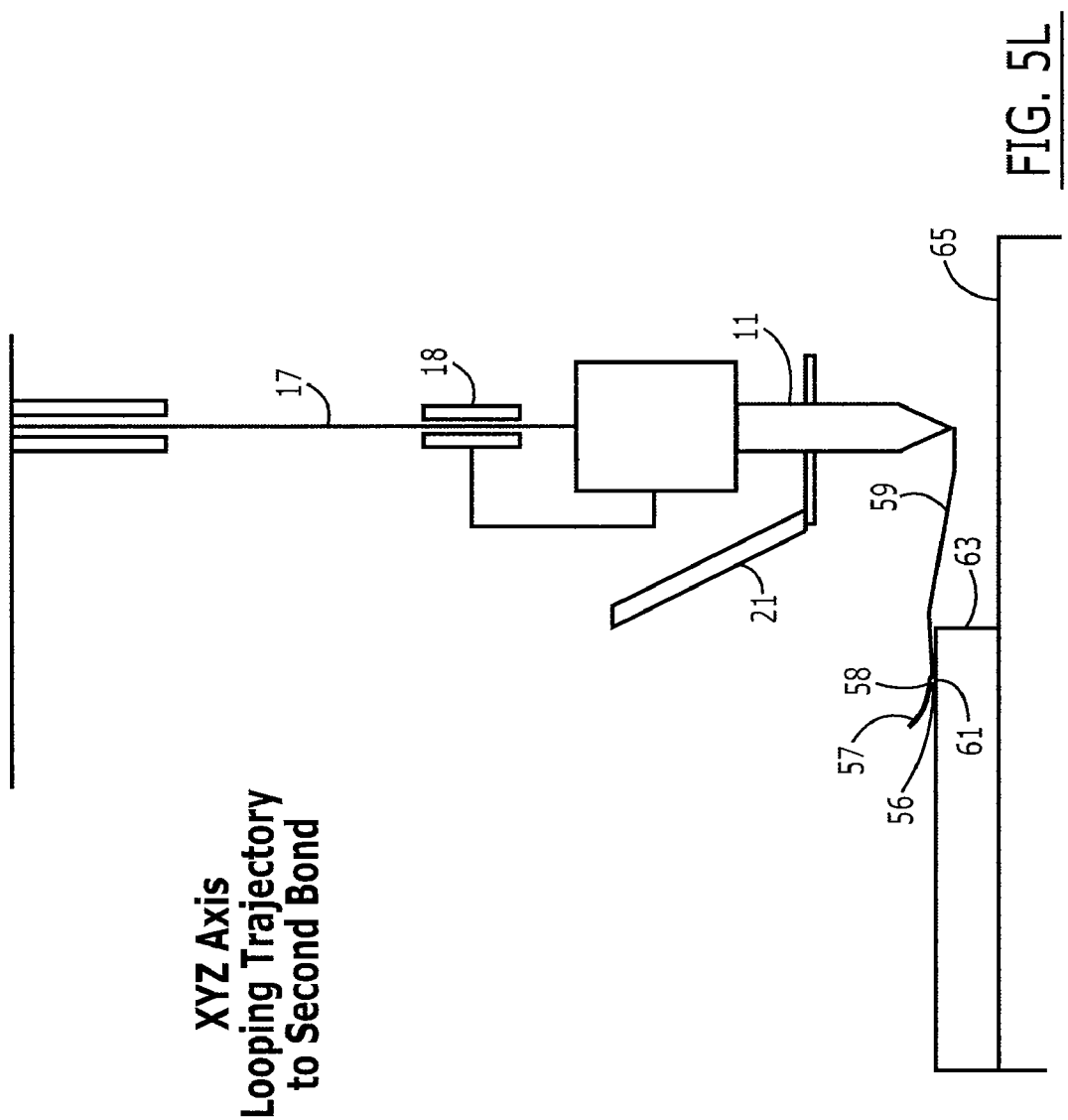

The capillary is now moved toward the second bond site through a set of coordinated xyz motions to form the desired wire loop shape (the fourth portion of the overall loop) and to position the capillary above the second bond site 65. FIGS. 5K and 5L show the position of the capillary 11 at two points along an exemplary trajectory to the second bond site 65.

The coordinated xyz motion can be relatively simple, comprising a straight xy motion toward the second bond site. However, typically there is motion in the z direction to help form the wire loop into the most preferable shape. As the wire has still not been severed since the beginning of the process, the wire loop 59 is continuous with the bump 56, fold 57, and bond 58 at the first bond site.

Figure 5M:
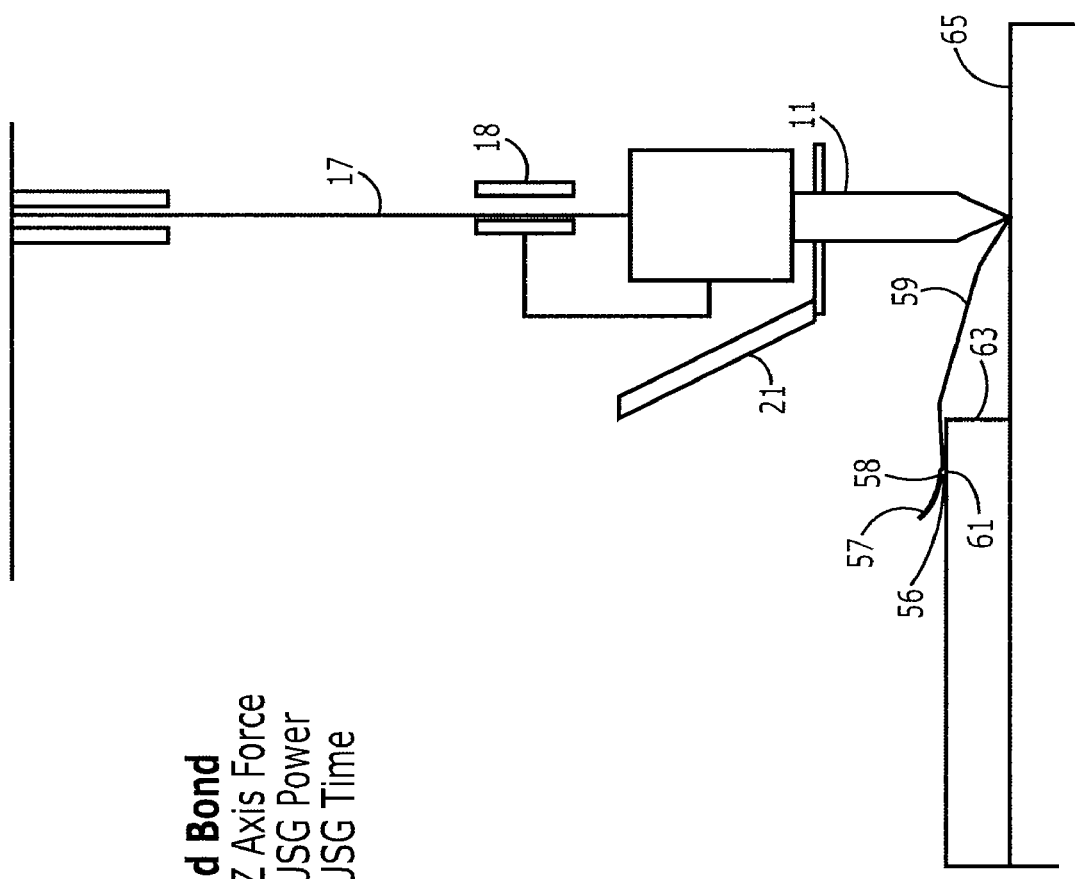
Figure 5N:
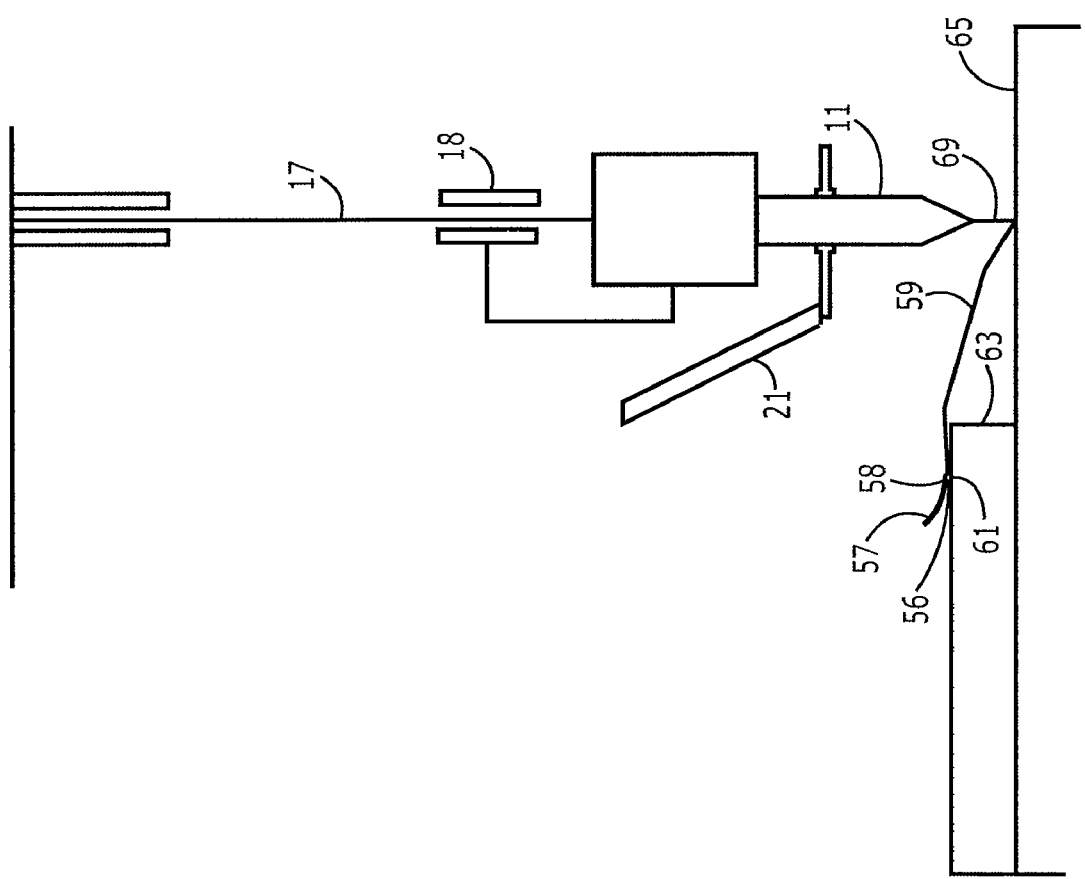
Figure 50:
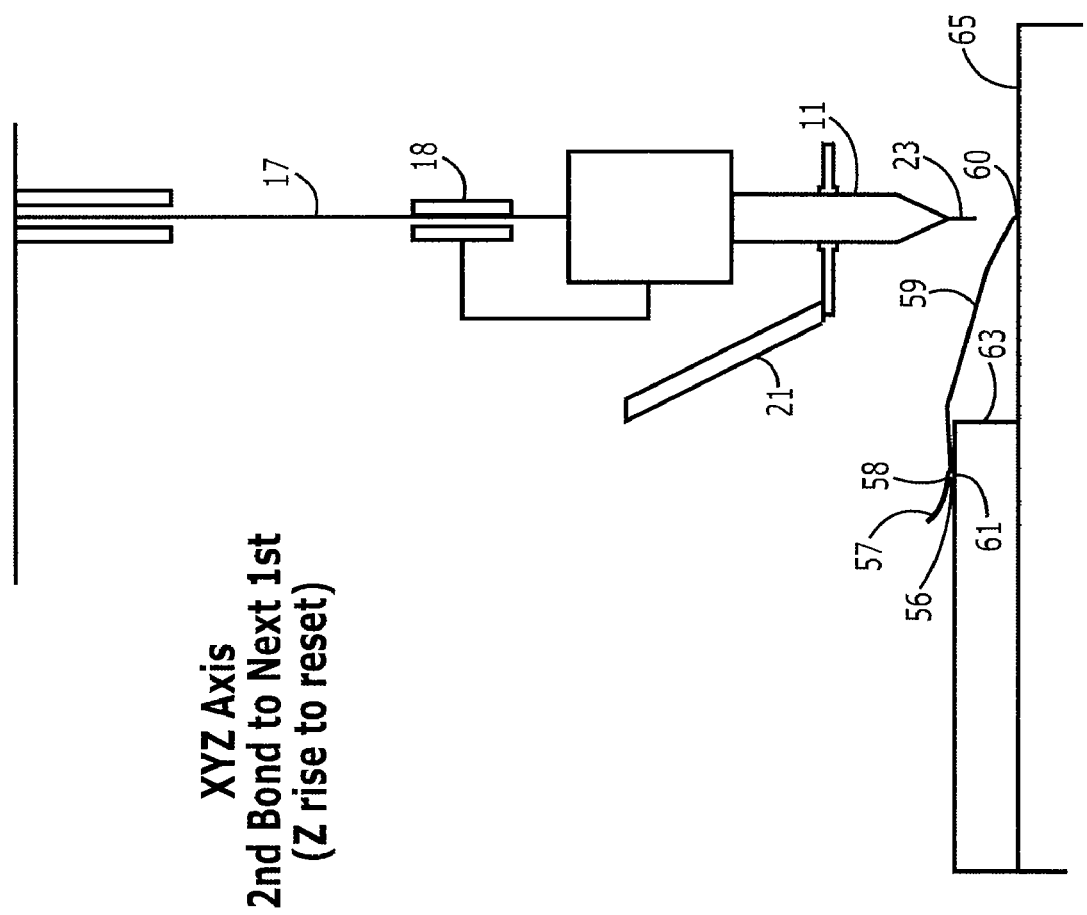

Next, the capillary is lowered to pinch the wire between the second bond surface 65 and the tip of the capillary 11 and the wire is stitch bonded to the second bond site. Heat and/or ultrasonic energy may be applied to facilitate bonding. At this point, the wire has been pinched, but has not been fully severed, as shown in FIG. 5M. The capillary 11 is then raised with the clamps 18 still open and with the wire still attached to the stitch bond 60 such that a wire tail 69 pays out of the capillary 11. FIG. 5N illustrates the position of the capillary at this point in the process. The clamps 18 are then closed and the capillary 11 is raised further to snap the wire at the stitch bond 60 as shown in FIG. 5O. The fifth portion of the overall folded forward wire loop, i.e., the stitch bond 60, is now completed and the entire folded forward looping process is concluded.

The main purposes of the bump 56 are to prevent direct contact of the capillary with the bond pad and to raise the height (z direction) from which the wire exits the first bond site. Specifically, the wire exits the first bond site at so low of an angle that, if not for the extra height above the die surface provided by starting the wire loop on top of a bump, the wire loop 59 might otherwise contact the die surface intermediate the first and second bond sites.

The primary purpose of forming the fold 57 on top of the bump is so that the wire exits the first bond site generally horizontally and pointing toward the second bond site, thus creating a low loop height. The fold is generally elliptical in shape with its major axis in the xy plane and the wire exits the end of the fold generally horizontally and generally pointing directly toward the second bond site. This orientation is to be contrasted with the generally straight upward orientation of the wire as it exits the first bond site in a conventional forward wire loop. Accordingly, the looping technique of the present invention provides ultra-low loop heights because the wire exits the ball bond site pointing horizontally rather than vertically upward.

In addition, the impact to the die is reduced relative to conventional reverse ball bonding because it does not perform a normal second bond on top of the bump, as is the case with reverse looping. The wire is only slightly compressed to form the loop and bond on top of the ball as in FIG. 7A in comparison to a normal stitch bond similar to FIG. 7B as in reverse bonding.

Further, finer pitches can be achieved with the present invention relative to reverse ball bonding because the bump is not compressed and squished out laterally as much as in the reverse wire looping technique.

The wire bonding machine is controlled by motion control system comprising control circuitry that can cause the machine to perform the processes described herein. Commonly, the circuitry comprises a digital processing device such as a programmed general purpose computer, a digital signal processor, a state machine, a combinational logic circuit, a microprocessor, an application specific integrated circuit, or any other known digital processing means. If the circuitry comprises a computer, the invention may reside largely, if not exclusively, in the software for programming the computer to control the wire bonding machine to perform the processes described herein.

Figure 6:
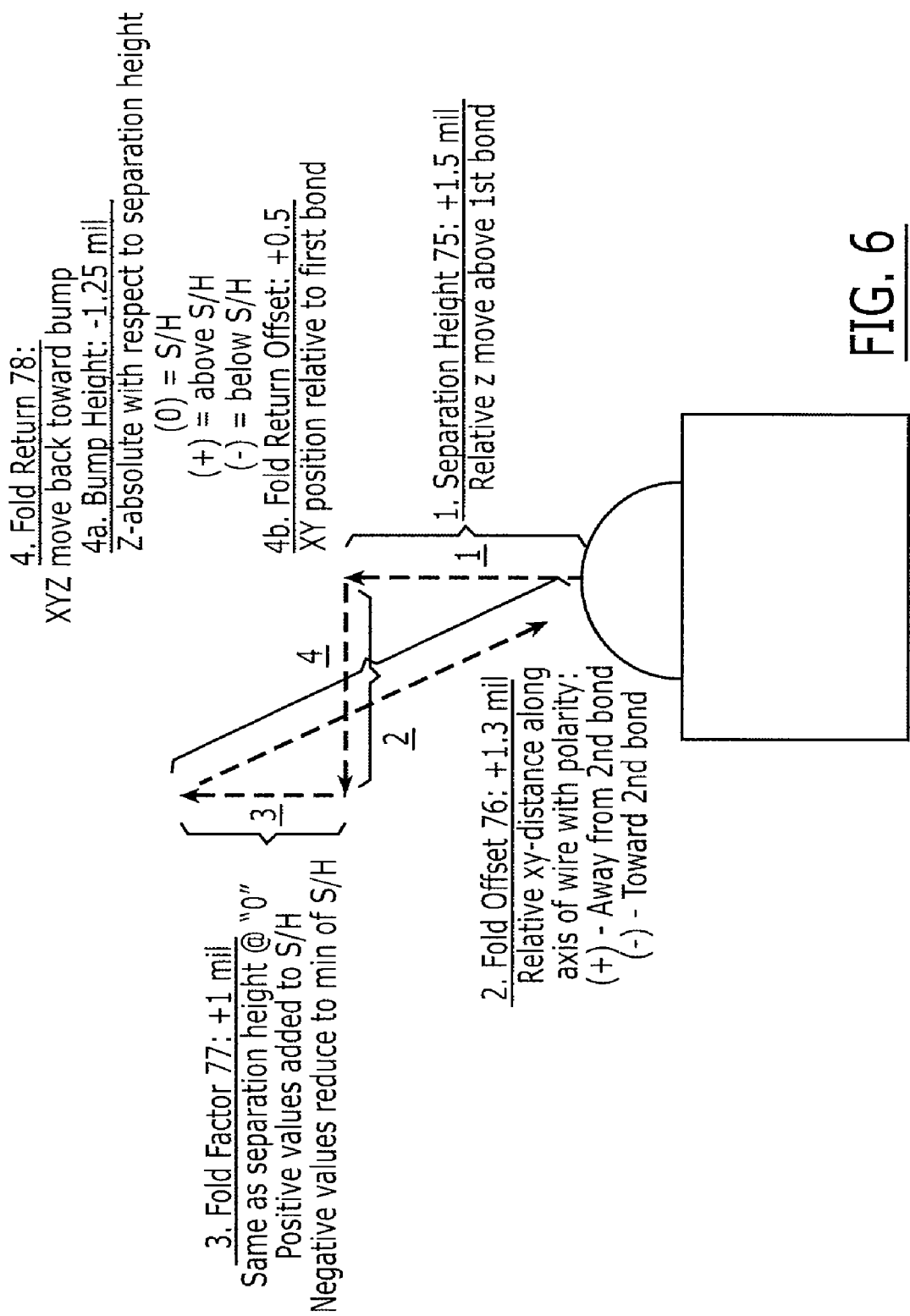
FIG. 6 is a pictorial elevation view showing the various components of the set of xyz motions involved in forming a folded bump in accordance with particularly preferred exemplary embodiment of the invention.

By optimizing the various motion components described in connection with FIG. 4, we can achieve desired shape with low loop height and no neck damage. As an example, FIG. 6 shows exemplary parameters that were used to form the fold shown in FIG. 7A and subsequently the loop profile shown in FIGS. 8A and 8B. The first three motions (separation height 75, fold offset 76 and fold factor 77) collectively determine the amount of the wire in the fold and the shape of the fold. If these motions are too large, a larger fold than desired may be formed. If these motions are too small, a fold may not be formed at all and the neck region of the wire could be damaged.

Figure 7A:
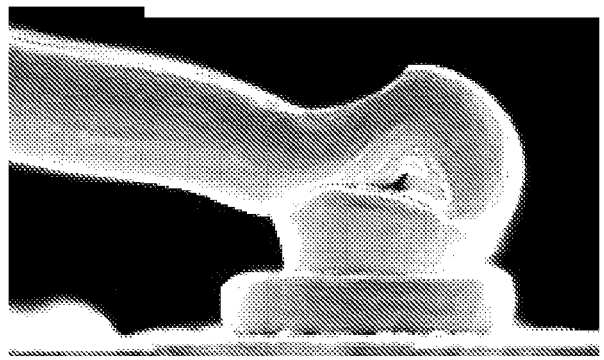
FIG. 7A is a side view of a bump and a fold of a wire formed on the bump formed using the exemplary parameters set forth in FIG. 6.
Figure 7B:
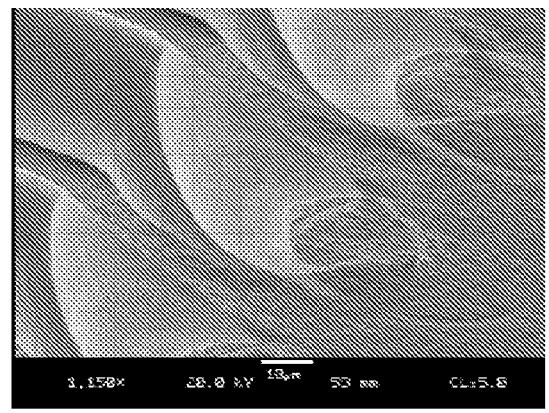
FIG. 7B is a stitch bond.
Figure 8A:
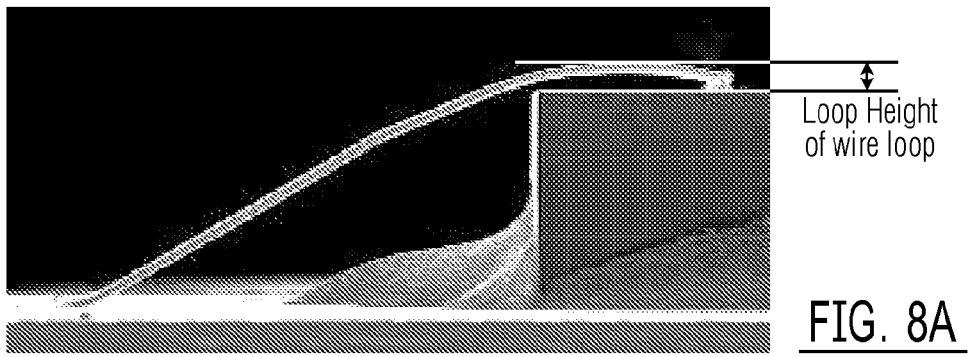
FIGS. 8A and 8B are scanning electron micrographs of a completed loop produced after forming the bump shown in FIG. 7A.
Figure 8B:
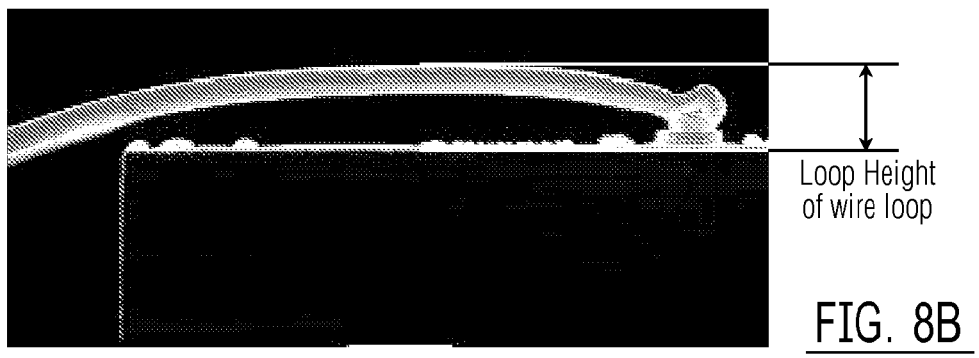

We have found through experimentation that a separation height and a fold offset slightly larger than the wire diameter (e.g., about 1.01 to 1.55 times the wire diameter) achieves excellent results. Furthermore, the fold factor should be a positive value. In the example of FIG. 7A, the separation height 75 is 1.5 mil, the fold offset 76 is 1.3 mil and the fold factor 77 is 1 mil for a wire of a diameter of 1 mil). These settings pay out the proper amount of wire and angle the wire around 30 degrees from the vertical before the fold return motion 78 starts.

The fold return motion 78 determines the final shape of the bump. In the particular machine we used, the fold return motion 78 is specified by two parameters. Specifically, (1) the aforementioned fold return offset parameter (which, along with the fold offset, dictates the horizontal component of the fold return motion) and (2) the bump height (which, along with the fold factor, dictates the vertical component of the return motion).

To form a good fold with enough deformation to sustain the fold without overly flattening the bump, bump height normally should be a negative value (bump height being a vertical distance from the separation height). In this example, the bump height is −1.25 mil and the separation height is 1.5 mil. Thus, the final position of the capillary is about 0.25 mil above the bump 56. This provides just enough flattening of the wire to form the fold without flattening the bump significantly. The fold return offset in this example is 0.5 ml, which means that the final position of the capillary after the fold return motion 78 is offset 0.5 mil horizontally from the center of the bump (away from the second bond 60). These settings ensure that the site of the bond 58 is centered on top of the bump 56.

The wire loop resulting from bonding using these parameters is shown in FIG. 8. Over multiple experimental samples, the average loop height using these parameters was 2.3 mil. The maximum loop height was 2.5 mil.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

What is claimed:

1. A wire loop interconnect between a first bond site and a second bond site comprising:
   (1) a ball bond at the first bond site;
   (2) a fold of wire continuous with the ball bond, at least a portion of the fold of wire being bonded on top of the ball bond, the fold of wire being formed using the steps of, in order: (2.1) raising a capillary above the ball bond formed at the first bond site a distance between 1.01 and 1.55 times the diameter of the wire, (2.2) then moving the capillary horizontally away from a second bond site a distance between 1.01 and 1.55 times the diameter of the wire, and (2.3) then moving the capillary back toward the ball bond at the first bond site;
   (3) a wire loop between the fold of wire and the second bond site, the wire loop comprising wire continuous with the fold of wire; and
   (4) a bond at the second bond site terminating the wire loop interconnect, whereby the wire loop has a loop height less than or equal to 2.5 mils.

2. The wire loop interconnect of claim 1 wherein the fold of wire is generally elliptical in shape.

3. The wire loop interconnect of claim 1 wherein the wire loop exits the top of the ball bond toward the second bond site substantially horizontally.

4. The wire loop interconnect of claim 1 wherein the first bond site is higher than the second bond site.

5. The wire loop interconnect of claim 4 wherein the first bond site is on a semiconductor die and the second bond site is on a substrate carrying the semiconductor die.

* * * * *